United States Patent
Fukuzaki et al.

(10) Patent No.: US 11,276,768 B2
(45) Date of Patent: Mar. 15, 2022

(54) SEMICONDUCTOR DEVICE

(71) Applicant: SONY SEMICONDUCTOR SOLUTIONS CORPORATION, Kanagawa (JP)

(72) Inventors: Yuzo Fukuzaki, Kanagawa (JP); Koji Fukumoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/964,648

(22) PCT Filed: Jan. 16, 2019

(86) PCT No.: PCT/JP2019/001056
§ 371 (c)(1),
(2) Date: Jul. 24, 2020

(87) PCT Pub. No.: WO2019/150947
PCT Pub. Date: Aug. 8, 2019

(65) Prior Publication Data
US 2021/0057548 A1    Feb. 25, 2021

(30) Foreign Application Priority Data
Feb. 2, 2018 (JP) .............................. JP2018-017288

(51) Int. Cl.
*H01L 29/66* (2006.01)
*H01L 29/786* (2006.01)

(52) U.S. Cl.
CPC .... *H01L 29/66742* (2013.01); *H01L 29/7869* (2013.01)

(58) Field of Classification Search
CPC .................. H01L 29/66742; H01L 29/7869
(Continued)

(56) References Cited

U.S. PATENT DOCUMENTS

2005/0040444 A1* 2/2005 Cohen ............... H01L 29/66795
257/288
2005/0205932 A1 9/2005 Cohen
(Continued)

FOREIGN PATENT DOCUMENTS

| JP | 2005-072582 | 3/2005 |
|----|-------------|--------|
| JP | 2006-306172 | 12/2008 |
| JP | 2015-195405 | 11/2015 |

OTHER PUBLICATIONS

International Search Report and Written Opinion prepared by the Japanese Patent Office dated Apr. 2, 2019, for International Application No. PCT/JP2019/001056.

*Primary Examiner* — Tong-Ho Kim
(74) *Attorney, Agent, or Firm* — Sheridan Ross P.C.

(57) ABSTRACT

A semiconductor device including a structure having N gate electrode layers G and (N−1) channel formation region layers CH (where N≥3) alternately juxtaposed on an insulating material layer formed on a surface of a conductive substrate. Each of the structure, the channel formation region layer CH, and the gate electrode layer G has a bottom surface, a top surface, and four side surfaces. A second surface of the $n^{th}$ channel formation region layer is connected to a fourth surface of the $n^{th}$ gate electrode layer. A fourth surface of the $n^{th}$ channel formation region layer is connected to a second surface of the $(n+1)^{th}$ gate electrode layer. One of an odd-numbered layer of the gate electrode layers and an even-numbered layer of the gate electrode layers is connected to a first contact portion and the other is connected to a second contact portion.

8 Claims, 15 Drawing Sheets

(58) Field of Classification Search
USPC .......................................................... 257/59
See application file for complete search history.

(56) References Cited

U.S. PATENT DOCUMENTS

2008/0277725 A1\* 11/2008 Shino ................ H01L 27/10844
                                                                                     257/347
2017/0263728 A1    9/2017  Kittl et al.
2017/0365881 A1  12/2017  Doris et al.

\* cited by examiner

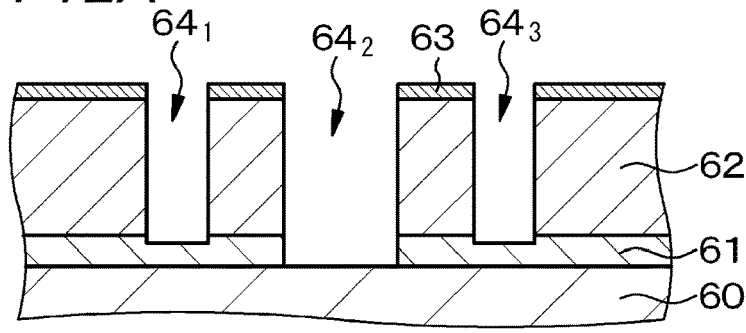
FIG. 12A
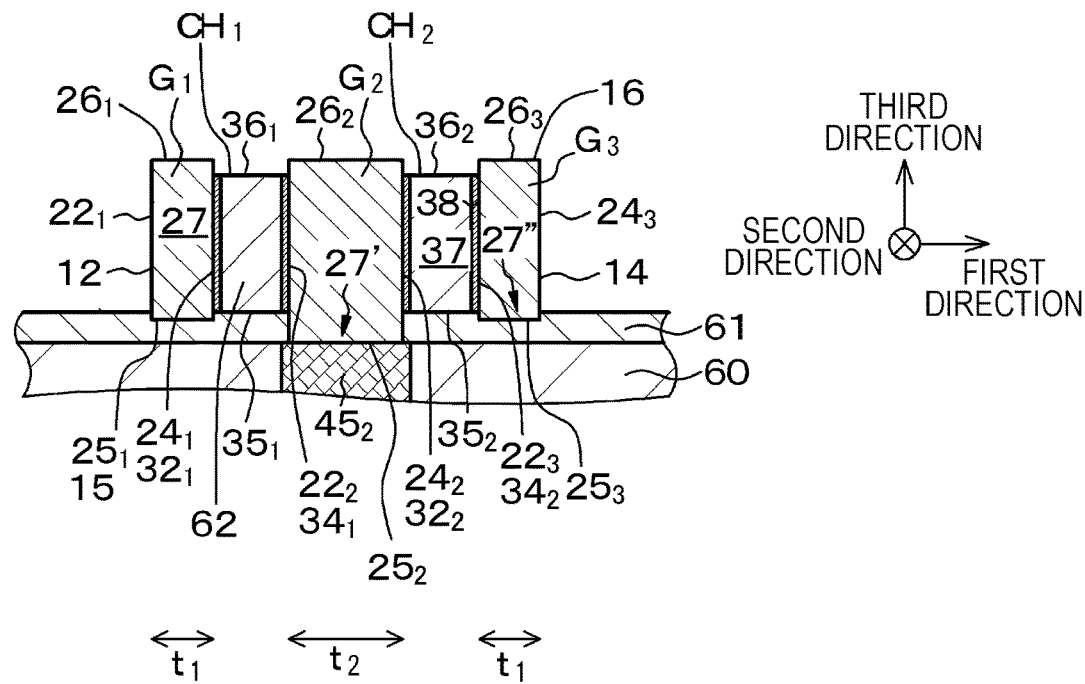
FIG. 12B
FIG. 13

US 11,276,768 B2

SEMICONDUCTOR DEVICE

CROSS REFERENCE TO RELATED APPLICATIONS

This application is a national stage application under 35 U.S.C. 371 and claims the benefit of PCT Application No. PCT/JP2019/001056 having an international filing date of 16 Jan. 2019, which designated the United States, which PCT application claimed the benefit of Japanese Patent Application No. 2018-017288 filed 2 Feb. 2018, the entire disclosures of each of which are incorporated herein by reference.

TECHNICAL FIELD

The present disclosure relates to a semiconductor device, and more specifically, to a field-effect transistor having the structure of nanowire or nanosheet.

BACKGROUND ART

The scaling trend of advanced MOS transistors from 2012 is described. The use of a bulk planar MOSFET is dominant in 20-nm technology generation. In 14-nm technology generation and later, the trend is going to move toward full employment of a Fin-structured FET (referred to as "Fin-FET" for convenience of description) or a FET having fully depleted-silicon on insulator (FD-SOI) structure (referred to as "FD-SOI-FET" for convenience of description). Although the thickness of a silicon layer that is closely related to the gate length scaling, that is, the thicknesses of the Fin structure in the Fin-FET or a silicon layer in the FD-SOI-FET is an important factor in the FET miniaturization, the silicon layer is considered to have a technical limit of 5-nm thickness.

A FET having nanowire structure (referred to as "nanowire FET" for convenience of description) can be mentioned as a technique for breaking through the limitation on the thickness of the silicon layer forming a channel formation region of FET as mentioned above (e.g., see Japanese Patent Application Laid-Open No. 2015-195405).

Applying, incidentally, a back bias to the channel formation region enables the performance to be improved in tune with the operation of the transistor, resulting in reducing leakage current. Specifically, in one example, applying $+V_{dd}$ to one of gate electrodes sandwiching the channel formation region and applying $+V_{dd}$ to the other of the gate electrodes sandwiching the channel formation region make it possible to improve the transistor drive capability. In addition, in one example, applying 0 volt to one of the gate electrodes sandwiching the channel formation region and applying $-V_{dd}$ to the other of the gate electrodes sandwiching the channel formation region make it possible to reduce the leakage current in the off state of the transistor.

CITATION LIST

Patent Document

Patent Document 1: Japanese Patent Application Laid-Open No. 2015-195405

SUMMARY OF THE INVENTION

Problems to be Solved by the Invention

The nanowire FET disclosed in Patent Document 1 mentioned above, however, fails to apply a back bias to the channel formation region because gate electrodes surround the periphery of the nanowire-structured channel formation region. In other words, the nanowire FET disclosed in Patent Document 1 mentioned above is incapable of reducing leakage current while improving the performance in tune with the operation of a transistor.

The present disclosure is thus intended to provide a semiconductor device that is capable of reducing leakage current while improving performance in tune with the operation of a transistor.

Solutions to Problems

A semiconductor device of the present disclosure for achieving the above-described object includes:

a structure having N gate electrode layers and (N−1) channel formation region layers (where N≥3) alternately juxtaposed on an insulating material layer of a base in which the insulating material layer is formed on a surface of a conductive substrate, in which the structure has a bottom surface, a top surface opposing the bottom surface, a first side surface, a second side surface, a third side surface opposing the first side surface, and a fourth side surface opposing the second side surface, the channel formation region layer has a bottom surface forming the bottom surface of the structure, a top surface forming the top surface of the structure, a first side surface forming the first side surface of the structure, a second side surface, a third side surface forming the third side surface of the structure, and a fourth side surface opposing the second side surface, the gate electrode layer has a bottom surface forming the bottom surface of the structure, a top surface forming the top surface of the structure, a first side surface forming the first side surface of the structure, a second side surface, a third side surface forming the third side surface of the structure, and a fourth side surface opposing the second side surface, a second surface of a $1^{st}$ layer of the gate electrode layers forms the second side surface of the structure, a fourth surface of an $N^{th}$ layer of the gate electrode layers forms the fourth side surface of the structure, a second surface of an $n^{th}$ (where n=1, 2, ..., (N−1)) layer of the channel formation region layers is in contact with the fourth surface of the $n^{th}$ gate electrode layer, a fourth surface of the $n^{th}$ layer of the channel formation region layers is in contact with a second surface of a $(n+1)^{th}$ layer of the gate electrode layers, and one of an odd-numbered layer of the gate electrode layers and an even-numbered layer of the gate electrode layers is connected to a first contact portion and the other is connected to a second contact portion.

BRIEF DESCRIPTION OF DRAWINGS

FIG. 8D, are similar schematic partial end views of a base or the like, taken along the arrow A-A in FIG. 1, for describing a method of manufacturing the semiconductor device according to the second embodiment.

FIGS. 12A and 12B are similar schematic partial end views of a semiconductor device according to a fourth embodiment, taken along the arrow A-A in FIG. 1.

FIG. 13 is a similar schematic partial end view of a modification of the semiconductor device according to the fourth embodiment, taken along the arrow A-A in FIG. 1.

FIG. 14D, are similar schematic partial end views of a base or the like, taken along the arrow A-A in FIG. 1, for describing a method of manufacturing the semiconductor device according to the fifth embodiment.

MODE FOR CARRYING OUT THE INVENTION

Figure 1:
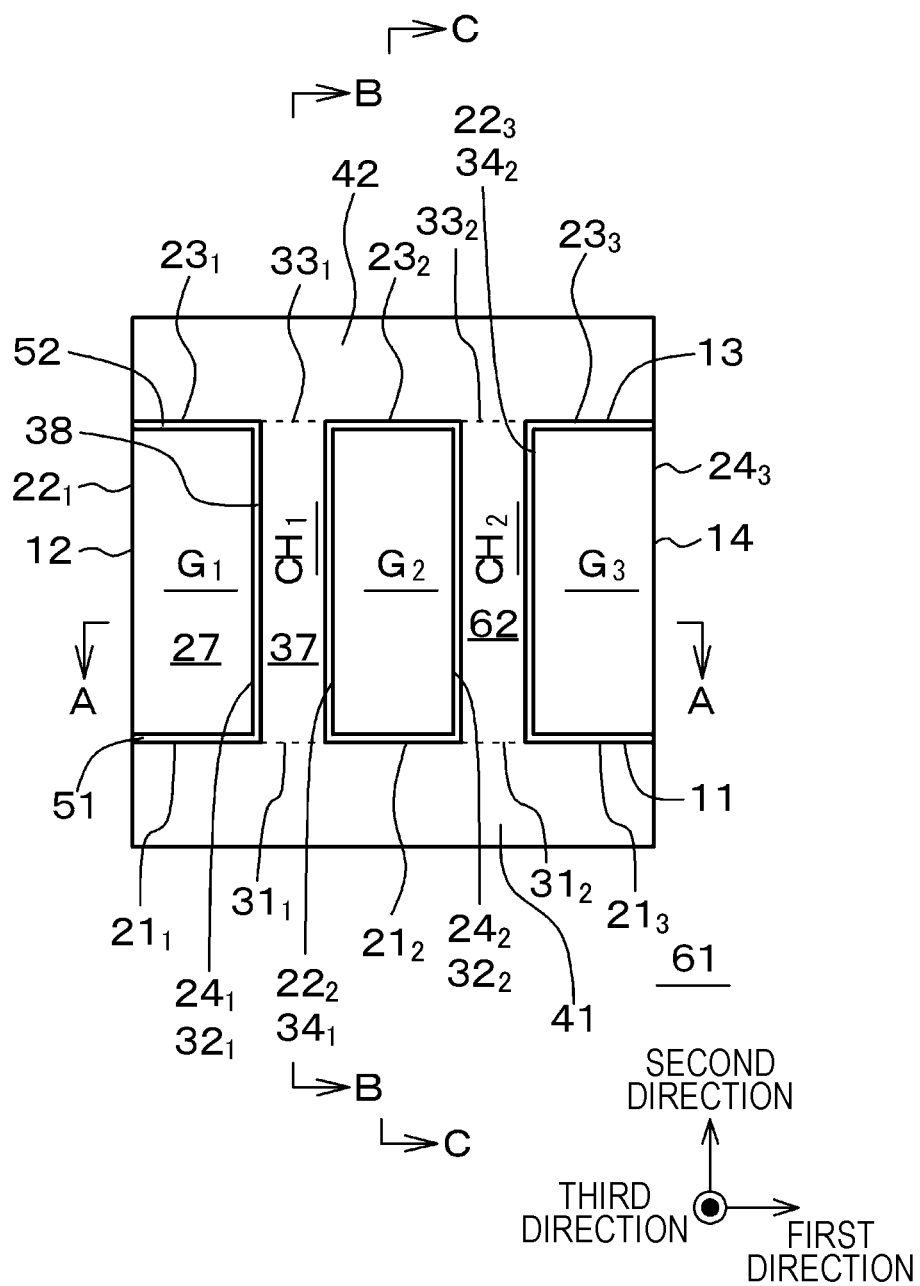
FIG. 1 is a conceptual diagram illustrating arrangement of each component of a semiconductor device according to a first embodiment.

Hereinafter, the present disclosure will be described on the basis of embodiments with reference to the drawings, but the present disclosure is not limited to the embodiments, and the various numerical values and materials in the embodiments are for illustrative purposes. Note that the description will proceed in the following order.

1. General description of semiconductor device of the present disclosure
2. First embodiment (semiconductor device of the present disclosure)
3. Second embodiment (modification of first embodiment)
4. Third embodiment (modification of second embodiment)
5. Fourth embodiment (modification of second embodiment and third embodiment)
6. Fifth embodiment (modification of first embodiment to fourth embodiment)
7. Others General Description of Semiconductor Device of the Present Disclosure In a semiconductor device of the present disclosure, a channel formation region layer is capable of including a channel structure portion having the structure of nanowire or nanosheet and an insulating portion. Specifically, the direction from a second side surface to a fourth side surface of the structure is assumed to be a first direction (X-direction). The direction from a first side surface to a third side surface of the structure is assumed to be a second direction (Y-direction). The direction from a top surface to a bottom surface of the structure is assumed to be a third direction (Z-direction). In this case, a channel structure portion forming one channel formation region layer includes one or a plurality of nanowire structures or nanosheet structures extending in the second direction (Y-direction). An outer peripheral portion or a part of the nanowire structure or the nanosheet structure is covered with an insulating portion (corresponding to a gate insulating film). In addition, one or a plurality of nanowire structures or nanosheet structures is juxtaposed along the third direction (Z-direction) in one channel formation region layer. Moreover, the X, Y, and Z directions have a relationship in which their projected images are orthogonal to each other.

In the semiconductor device of the present disclosure including the preferable modes described above, it can be a mode in which a first surface of the channel formation region layer is connected to one of source/drain regions common to the channel formation region layer and a third surface of the channel formation region layer is connected to the other of the source/drain regions common to the channel formation region layer.

Furthermore, in the semiconductor device of the present disclosure including various preferable modes described above, a first contact portion is formed above a base, and is connected to a first wiring (specifically, e.g., a wiring functioning as a signal line; the same applies to the following description). The extension of a gate electrode layer extends in the insulating material layer. A second contact portion connected to the extension of the gate electrode layer can be configured to be connected to a second wiring formed on a conductive substrate (specifically, e.g., a wiring functioning as a back bias potential power supply line for applying a back bias such as a reverse back bias or a forward back bias or alternatively a wiring functioning as a power supply line $V_{dd}$ or a power supply line $V_{ss}$; the same applies to the following description). Then, in this case, the extension of the gate electrode layer may be formed to penetrate the insulating material layer. Furthermore, in this case, a thickness along a first direction (X-direction) of the gate electrode layer connected to the second contact portion may be formed to be larger than a thickness along the first direction (X-direction) of the gate electrode layer connected to the first contact portion, the first direction (X-direction) being given as a direction from the second side surface of the structure to the fourth side surface of the structure.

In the semiconductor device of the present disclosure including the various preferred embodiments described above (hereinafter, referred to as "semiconductor device or the like of the present disclosure"), examples of the base can include a silicon semiconductor substrate, a Si-on-insulator (SOI) substrate, or a SiGe-on-insulator (SGOI) substrate. Examples of materials forming the channel structure portion can include Si, SiGe, Ge, and InGaAs. The semiconductor device or the like of the present disclosure can be either an n-channel type or a p-channel type. In the case of employing an n-channel type, the channel structure can include Si, and in the case of employing a p-channel type, the channel structure portion can include SiGe. The determination as to whether the semiconductor device or the like of the present disclosure is an n-channel type or a p-channel type is performed solely by selecting a material forming the gate electrode layer from the viewpoint of obtaining an optimum work function for each. In the case of using the Si-channel structure portion and the n-channel semiconductor device, examples of a material for forming the gate electrode layer can include TiN, TaN, Al, TiAl, and W. On the other hand, in the case of using the SiGe-channel structure portion and the p-channel semiconductor device, examples of a material for forming the gate electrode layer can include TiN and W. Examples of a material forming the insulating portion corresponding to the gate insulating film can include SiN, SiON, and $SiO_2$, or can include high dielectric constant materials (so-called High-k material), such as $HfO_2$, HfAlON, and $Y_2O_3$.

In the nanowire structure, both ends of a wire of a diameter of, in one example, 5 nm to 10 nm and constituted by including, in one example, Si or SiGe, are supported by one and the other of source/drain regions. In addition, in the nanosheet structure, both ends of a material that has a cross-sectional shape of substantially rectangular constituted by including, in one example, Si or SiGe whose width× thickness is, in one example, (10 nm to 50 nm)×(5 nm to 10 nm) are supported by one and the other of source/drain regions. Moreover, the determination as to whether to use nanowire structure or nanosheet structure depends on the thickness and width of the material forming the structure as mentioned above. Examples of the material forming the source/drain regions can include silicon (Si), SiGe, and Ge. In addition, examples of materials forming the first contact portion and the second contact portion can include silicon (Si), aluminum or aluminum-based alloy (e.g., pure aluminum, Al—Si, Al—Cu, Al—Si—Cu, Al—Ge, Al—Si—Ge), polysilicon, copper, copper alloy, tungsten, tungsten alloy, titanium, titanium alloy (including TiW, TiNW, TiN, and TiAl), $WSi_2$, $MoSi_2$, and TaN. Furthermore, an insulating film described later includes $SiO_2$, SiN, or SiON. In addition, in a case where the base is formed by including a silicon semiconductor substrate, examples of materials forming the insulating material layer can include $SiO_x$-based materials (materials forming silicon-based oxide film); SiN-based materials including SiON-based materials such as SiN and SiON; SiOC; SiOF; and SiCN. Examples of $SiO_x$-based materials include $SiO_2$, non-doped silicate glass (NSG), borophosphosilicate glass (BPSG), PSG, BSG, AsSG, SbSG, PbSG, spin-on-glass (SOG), low temperature oxide (LTO, low temperature CVD-$SiO_2$), low-melting glass, and glass paste. Alternatively, examples of materials forming the insulating material layer can include inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Alternatively, examples of materials forming the insulating material layer can include various resins such as polyimide-based resin, epoxy-based resin, or acrylic resin and low dielectric constant insulating materials such as SiOCH, organic SOG, or fluorine-based resin (e.g., a material having a dielectric constant k ($=\varepsilon/\varepsilon_0$) of, e.g., 3.5 or less, specifically, e.g., fluorocarbon, cycloperfluorocarbon polymer, benzocyclobutene, cyclic fluororesin, polytetrafluoroethylene, amorphous tetrafluoroethylene, polyarylether, fluorinated arylether, fluorinated polyimide, amorphous carbon, parylene (polyparaxylylene), or fluorinated fullerene). Alternatively, examples of materials forming the insulating material layer can include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used alone or in appropriate combination thereof. The interlayer insulating layer described later can also be formed using the above-mentioned materials. The insulating material layer and the interlayer insulating layer can be formed using known methods including various CVD methods, various coating methods, various PVD methods such as a sputtering method and a vacuum evaporation method, various printing methods such as a screen printing method, plating methods, electrodeposition methods, immersion methods, and sol-gel methods.

First Embodiment

Figure 2A:
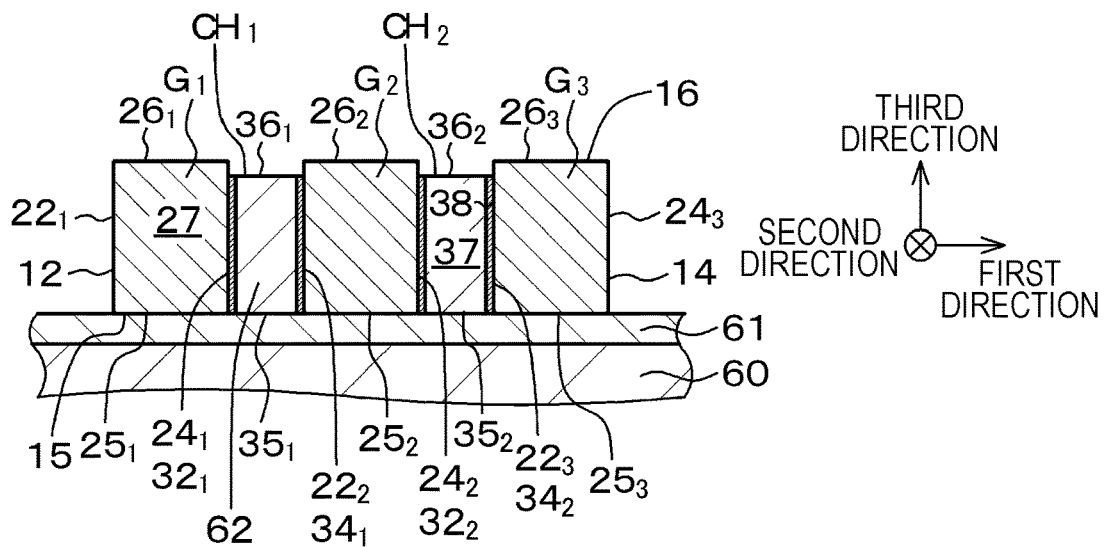
FIGS. 2A, 2B, and 2C are respectively schematic partial end views of the semiconductor device according to the first embodiment, which are taken along arrows A-A, B-B, and C-C in FIG. 1.
Figure 2B:
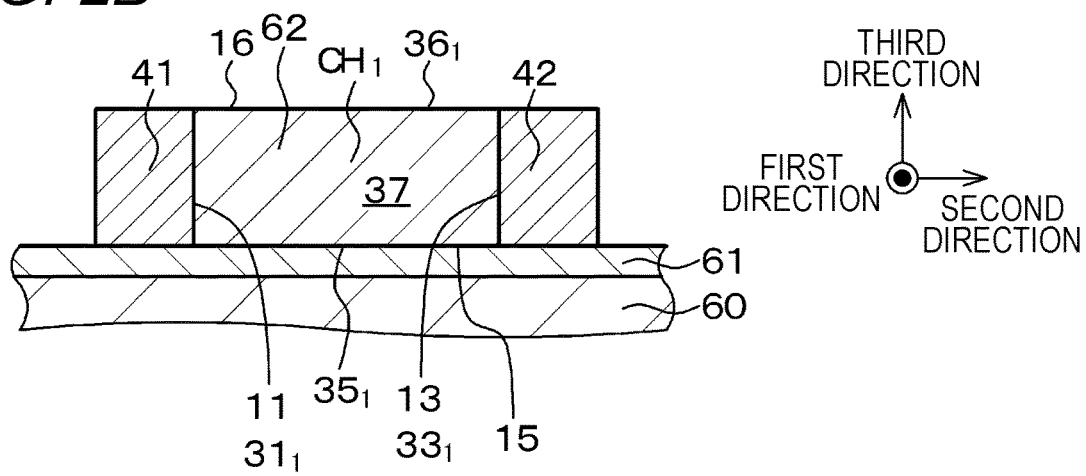
Figure 2C:
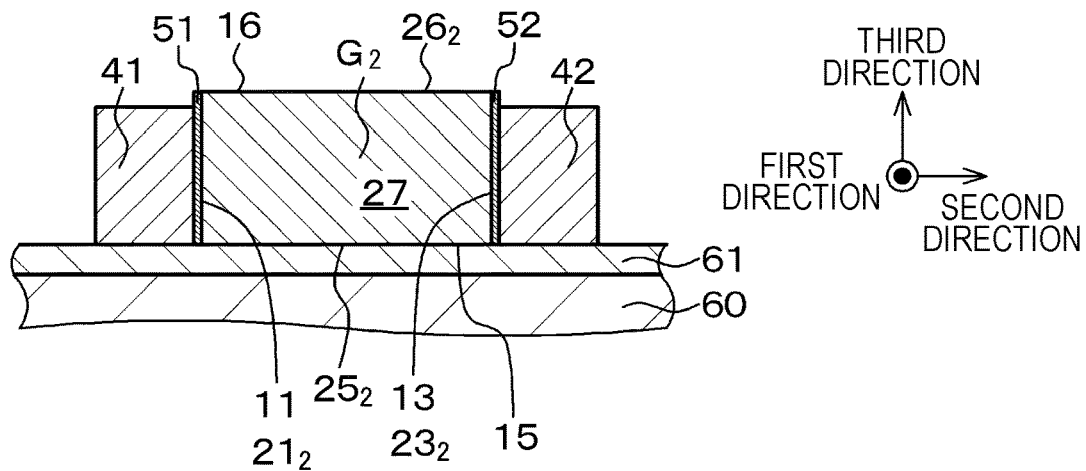
Figure 3A:
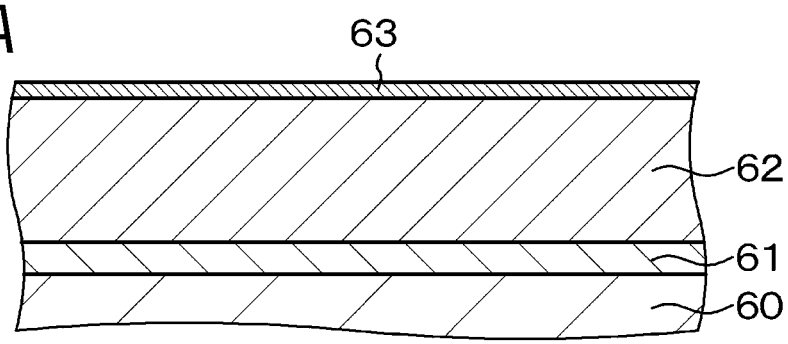
FIGS. 3A and 3B are similar schematic partial end views of a base or the like, which are taken along the arrow A-A in FIG. 1.
Figure 3B:
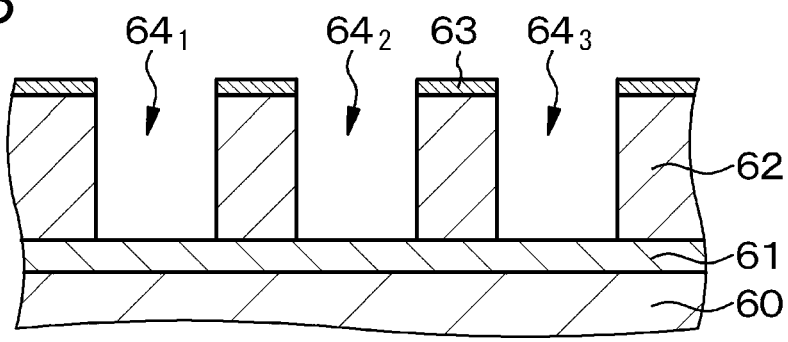
Figure 3C:
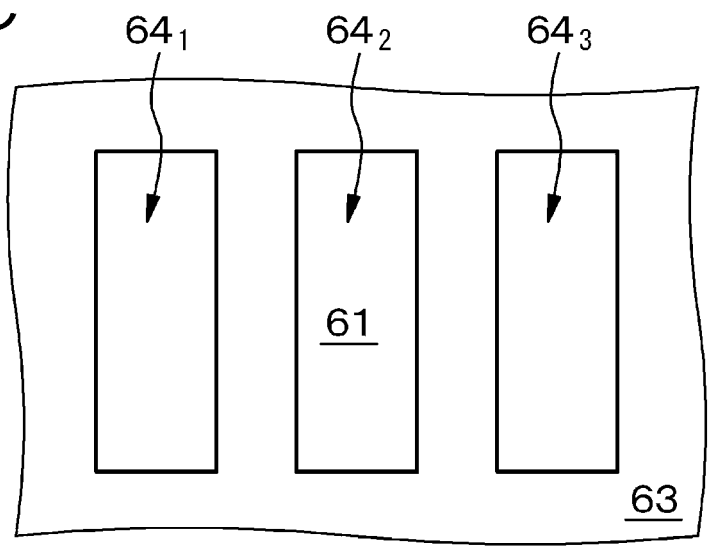
FIG. 3C is a schematic partial plan view of a base or the like corresponding to FIG. 3B, for describing a method of manufacturing the semiconductor device according to the first embodiment.
Figure 4A:
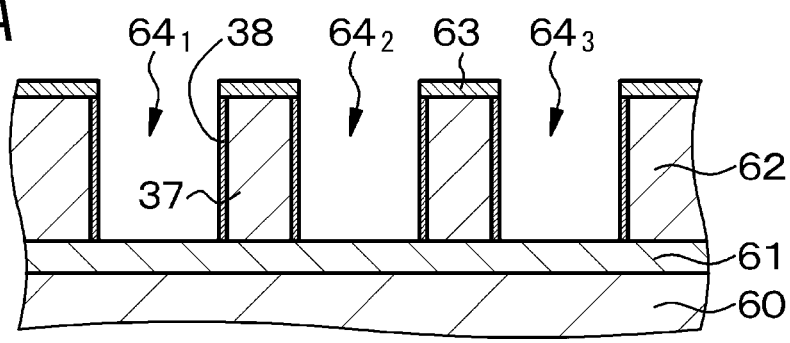
FIGS. 4A and 4B are, following FIG. 3B, similar schematic partial end views of a base or the like, which are taken along the arrow A-A in FIG. 1.
Figure 4B:
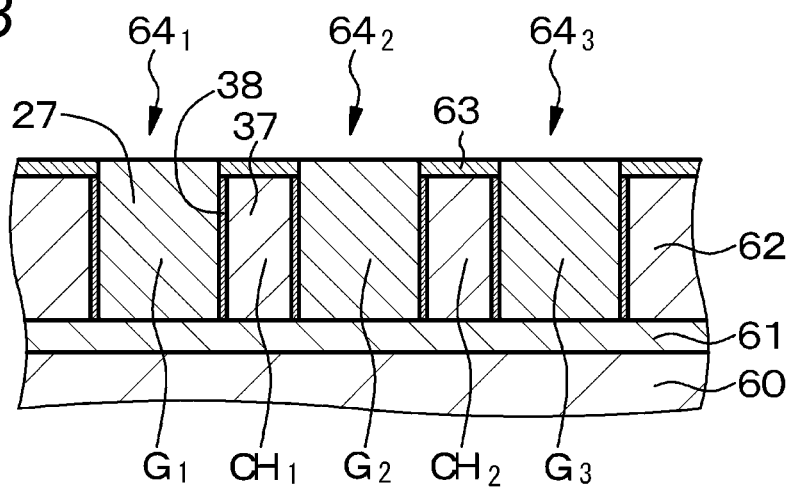
Figure 4C:
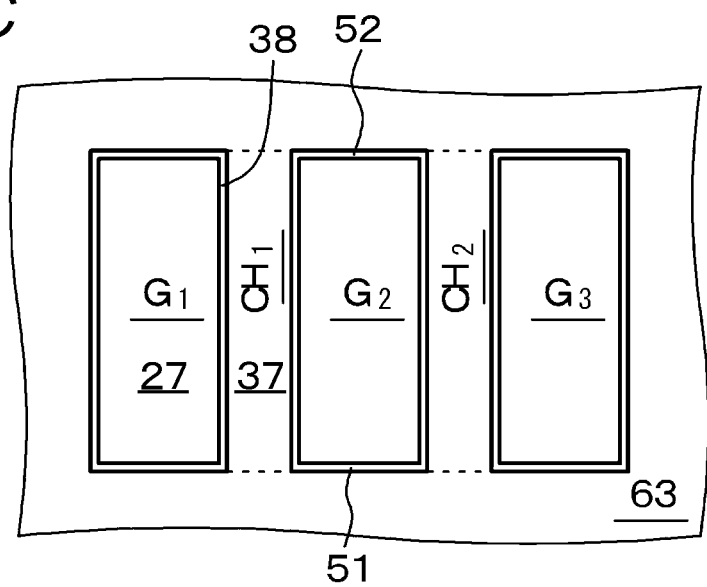
FIG. 4C is a schematic partial plan view of a base or the like corresponding to FIG. 4B, for describing a method of manufacturing the semiconductor device according to the first embodiment.
Figure 5A:
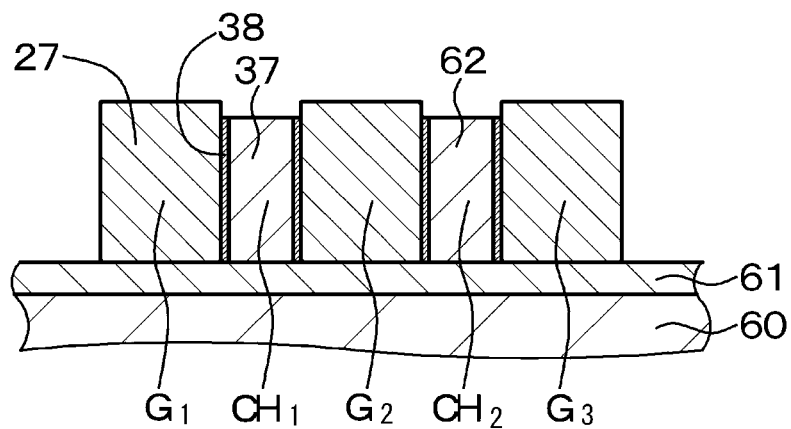
FIG. 5A is, following FIG. 4B, similar schematic partial end views of a base or the like, which are taken along the arrow A-A in FIG. 1.
Figure 5B:
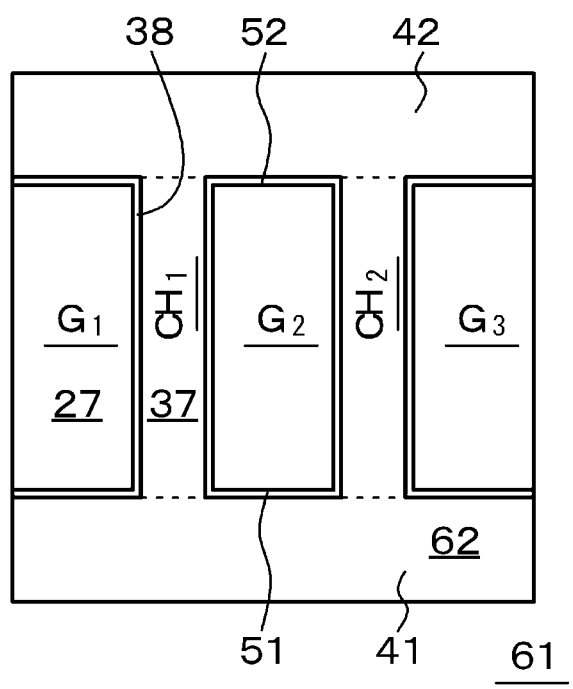
FIG. 5B is a schematic partial plan view of a base or the like corresponding to FIG. 5A, for describing a method of manufacturing the semiconductor device according to the first embodiment.
Figure 6:
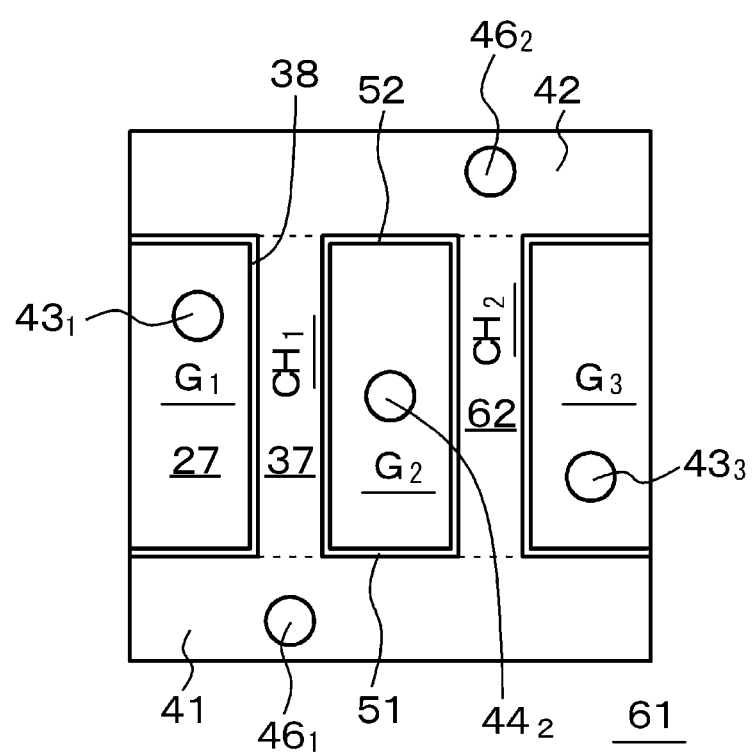
FIG. 6 is a schematic partial plan view of a base or the like for describing the method of manufacturing the semiconductor device according to the first embodiment, following FIG. 5B.

A first embodiment relates to a semiconductor device (field effect transistor and specifically nanowire FET) of the present disclosure. FIG. 1 is a conceptual diagram illustrating the arrangement of each component of the semiconductor device according to the first embodiment. FIGS. 2A, 2B, and 2C are respectively schematic partial end views of the semiconductor device according to the first embodiment, taken along arrows A-A, B-B, and C-C in FIG. 1.

The semiconductor device according to the first embodiment has a structure in which N gate electrode layers $G_1$, $G_2$, and $G_3$ and (N−1) channel formation region layers $CH_1$ and $CH_2$ (where N≥3) are alternately juxtaposed on an insulating material layer 61 formed on the surface of the conductive substrate 60 constituting a base. The base has a conductive substrate 60 and the insulating material layer 61.

The structure includes a bottom surface 15, a top surface 16 opposing the bottom surface 15, a first side surface 11, a second side surface 12, a third side surface 13 opposing the first side surface 11, and a fourth side surface 14 opposing the second side surface 12. Moreover, the top surface 16 of the structure has irregularities generated during manufacturing. The first side surface 11, the second side surface 12, the third side surface 13, and the fourth side surface 14 of the structure also have irregularities generated during manufacturing. In other words, the bottom surface, the top surface, and the side surfaces can be irregular surfaces in some cases. In addition, N=3 in the first embodiment.

Then, the channel formation region layers $CH_1$ and $CH_2$ have bottom surfaces $35_1$ and $35_2$, top surfaces $36_1$ and $36_2$, first side surfaces $31_1$ and $31_2$, second side surfaces $32_1$ and $32_2$, third side surfaces $33_1$ and $33_2$, and fourth side surfaces $34_1$ and $34_2$, respectively.

The bottom surfaces $35_1$ and $35_2$ form the bottom surface 15 of the structure.

The top surfaces $36_1$ and $36_2$ form the top surface 16 of the structure.

The first side surfaces $31_1$ and $31_2$ form the first side surface 11 of the structure.

The third side surfaces $33_1$ and $33_2$ form the third side surface 13 of the structure.

The fourth side surfaces $34_1$ and $34_2$ respectively oppose the second side surface $32_1$ and $32_2$.

The gate electrode layers $G_1$, $G_2$, and $G_3$ have bottom surfaces $25_1$, $25_2$, and $25_3$, top surfaces $26_1$, $26_2$, and $26_3$, first side surfaces $21_1$, $21_2$, and $21_3$, second side surfaces $22_1$, $22_2$, and $22_3$, third side surfaces $23_1$, $23_2$, and $23_3$, and fourth side surfaces $24_1$, $24_2$, $24_3$, respectively.

The bottom surfaces $25_1$, $25_2$, and $25_3$ form the bottom surface 15 of the structure.

The top surfaces $26_1$, $26_2$, and $26_3$ form the top surface 16 of the structure.

The first side surfaces $21_1$, $21_2$, and $21_3$ form the first side surface 11 of the structure.

The third side surfaces $23_1$, $23_2$, and $23_3$ form the third side surface 13 of the structure.

The fourth side surfaces $24_1$, $24_2$, $24_3$ respectively oppose the second side surfaces $22_1$, $22_2$, and $22_3$.

The second surface $22_1$ of the $1^{st}$ gate electrode layer $G_1$ forms the second side surface 12 of the structure.

The fourth surface $24_3$ of the $N^{th}$ gate electrode layer $G_3$ forms the fourth side surface 14 of the structure.

The second surfaces $32_1$ and $32_2$ of the $n^{th}$ (where n=1, 2, ..., (N−1)) channel formation region layers $CH_1$ and $CH_2$ are respectively connected to the fourth surfaces $24_1$ and $24_2$ of the $n^{th}$ gate electrode layers $G_1$ and $G_2$.

The fourth surfaces $34_1$ and $34_2$ of the $n^{th}$ channel formation region layers $CH_1$ and $CH_2$ are respectively in contact with the second surfaces $22_2$ and $22_3$ of the $(n+1)^{th}$ gate electrode layers $G_2$ and $G_3$.

There are the odd-numbered gate electrode layers $G_1$ and $G_3$ and the even-numbered gate electrode layer $G_2$.

One of them (in the first embodiment, specifically, the odd-numbered gate electrode layers $G_1$ and $G_3$) is connected to the first contact portions $43_1$ and $43_3$, and the other (in the first embodiment, specifically, the even-numbered gate electrode layer $G_2$) is connected to the second contact portion $44_2$.

Then, the channel formation region layers $CH_1$ and $CH_2$ include a channel structure portion 37 with nanowire structure or nanosheet structure (in the illustrated example, the nanosheet structure) and an insulating portion 38. Specifically, in the illustrated example, the channel structure portion 37 forming one channel formation region layer is configured as one nanosheet structure, and the portion of the nanosheet structure opposing the gate electrode layer is covered with the insulating portion 38 (corresponding to the gate insulating film). In addition, the first surfaces $31_1$ and $31_2$ of the channel formation region layers $CH_1$ and $CH_2$ are connected to the one source/drain region 41 of the source/drain regions common to the channel formation region layers $CH_1$ and $CH_2$. The third surfaces $33_1$ and $33_2$ of the channel formation region layers $CH_1$ and $CH_2$ are connected to the other source/drain region 42 of the source/drain regions common to the channel formation region layers $CH_1$ and $CH_2$. Furthermore, the first contact portions $43_1$ and $43_3$ are connected to a first wiring (not shown) (specifically, e.g., a wiring functioning as a signal line), and the second contact portion $44_2$ is connected to a second wiring (not shown) (Specifically, e.g., a wiring functioning as a back bias potential power supply line).

Further, the first side surfaces $21_1$, $21_2$, and $21_3$ of the respective gate electrode layers $G_1$, $G_2$, and $G_3$ are covered with an insulating film 51, and the fourth side surfaces $24_1$, $24_2$, and $24_3$ of the respective gate electrode layers $G_1$, $G_2$, and $G_3$ are covered with an insulating film 52.

The base is configured as an SOI substrate. In other words, the base has the conductive substrate 60 including a silicon semiconductor substrate and the insulating material layer 61 formed inside the conductive substrate 60. Specifically, the base has a stacked structure in which the conductive substrate 60 including a silicon semiconductor substrate, the insulating material layer 61, and the silicon layer 62 are arranged on top of each other. The channel structure portion 37 includes the silicon layer 62. The semiconductor device according to the first embodiment is an n-channel type. Examples of the material forming the gate electrode layers $G_1$, $G_2$, and $G_3$ can include TiN, TaN, Al, TiAl, and W (specifically, e.g., TiN). The gate insulating film forming a part of the insulating portion 38 includes SiON, and the gate insulating film forming the remaining part of the insulating portion 38 includes a high dielectric constant material, specifically, $HfO_2$. The source/drain regions 41 and 42 include silicon. The first contact portions $43_1$ and $43_3$ and the second contact portion $44_2$ include, in one example, silicon (Si), aluminum, or an aluminum-based alloy (e.g., pure aluminum, Al—Si, Al—Cu, Al—Si—Cu, Al—Ge, and Al—Si—Ge), polysilicon, copper, copper alloy, tungsten, tungsten alloy, titanium, titanium alloy (including TiW, TiNW, TiN, and TiAl), $WSi_2$, $MoSi_2$, and TaN. The insulating films 51 and 52 have a configuration similar to that of the insulating portion 38.

A method of manufacturing the semiconductor device according to the first embodiment is now described with reference to FIGS. 3A, 3B, 4A, 4B, and 5A and FIGS. 3C, 4C, 5B, and 6, for describing the method of manufacturing the semiconductor device according to the first embodiment. FIGS. 3A, 3B, 4A, 4B, and 5A are similar schematic partial end views of the base or the like, taken along the arrow A-A in FIG. 1. FIGS. 3C, 4C, 5B, and 6 are similar schematic partial plan views of the base or the like.

[Process-100]

A protective layer 63 including SiN is first formed on the top surface of the silicon layer 62 of the SOI substrate using the CVD method. Thus, the structure shown in FIG. 3A can be obtained.

[Process-110]

Then, the portion of the silicon layer 62 where the gate electrode layers $G_1$, $G_2$, and $G_3$ are to be formed is removed. Specifically, an etching resist layer (not shown) having an opening in a region where the gate electrode layers $G_1$, $G_2$, and $G_3$ are to be formed is provided on the protective layer 63. Then, the protective layer 63 and the silicon layer 62 are etched in a trench shape using the etching resist layer, and then the etching resist layer is removed. Thus, the structures shown in FIGS. 3B and 3C can be obtained. The removed portions of the silicon layer 62 where the gate electrode layers $G_1$, $G_2$, and $G_3$ are to be formed are indicated as openings $64_1$, $64_2$, $64_3$.

[Process-120]

Then, the channel structure portion 37 and the insulating portion 38 (corresponding to the gate insulating film) are formed in the silicon layer 62 to obtain the channel formation region layers $CH_1$ and $CH_2$. Specifically, a part of the insulating portion 38 (gate insulating film) made of SiON is formed by subjecting the exposed side wall of the silicon layer 62 to thermal oxidation. Then, the remaining portion (not shown) of the insulating portion 38 (the gate insulating film) made of $HfO_2$ layer is formed on a part of the insulating portion 38 (the gate insulating film) made of SiON using the atomic layer deposition (ALD) technique. Then, the remaining portion (the $HfO_2$ layer) of the insulating portion 38 (the gate insulating film) deposited on the bottoms of the openings $64_1$, $64_2$, and $64_3$ is removed by light etching. Thus, the structure shown in FIG. 4A can be obtained. In addition, as described above, the insulating films 51 and 52 can be formed together.

[Process-130]

Subsequently, a gate electrode forming layer 27 made of TiN is formed on the entire surface using the CVD method, then the gate electrode forming layer 27 above the channel formation region layers $CH_1$ and $CH_2$ is removed by performing the flattening process. The gate electrode forming layer 27 made of TiN fills the insides of the openings $64_1$, $64_2$ and $64_3$. Thus, the gate electrode layers $G_1$, $G_2$, and $G_3$ can be obtained (see FIGS. 4B and 4C).

[Process-140]

Then, the unnecessary silicon layer 62 is removed using the photolithography technique and the etching technique. Then, the protective layer 63 on the channel formation region layers $CH_1$ and $CH_2$ is removed using the photolithography technique and the etching technique, which enables obtaining of the source/drain regions 41 and 42 made of the silicon layer 62. In this way, the structures shown in FIGS. 5A, 5B, 1, 2A, 2B, and 2C can be obtained.

[Process-150]

Then, an interlayer insulating layer (not shown) is formed on the entire surface, and openings are formed in the interlayer insulating layers above the source/drain regions 41 and 42 and the gate electrode layers $G_1$, $G_2$, and $G_3$. Then, a conductive layer is formed on the interlayer insulating layer having the opening, and the conductive layer is patterned using the photolithography technique and the etching technique. Thus, the first contact portions $43_1$ and $43_3$ and the second contact portion $44_2$ can be obtained, connection holes $46_1$ and $46_2$ connected to the source/drain regions 41 and 42 (see FIG. 6) can be obtained, and the first wiring and the second wiring (not shown) can be obtained. Thus, it is possible to obtain the first contact portions $43_1$ and $43_3$ formed above the base and connected to the first wiring, and the second contact portion $44_2$ formed above the base and connected to the second wiring. Moreover, the first wiring and the second wiring are formed on the interlayer insulating layer.

The semiconductor device according to the first embodiment has the structure in which the channel formation region layer and the gate electrode layer are alternately juxtaposed. One of the odd-numbered and even-numbered gate electrode layers is connected to the first contact portion and the other is connected to the second contact portion. Specifically, the odd-numbered gate electrode layers are connected to the first contact portion, and the even-numbered gate electrode layers are connected to the second contact portion. Thus, different voltages can be applied to the odd-numbered gate electrode layers and the even-numbered gate electrode layers, that is, a back bias different from the gate potential can be applied. This makes it possible to reduce leakage current while improving performance in tune with the operation of the semiconductor device. Specifically, it is expected that the standby current can be reduced by 50% and the maximum frequency is increased by 30%.

Figure 16:
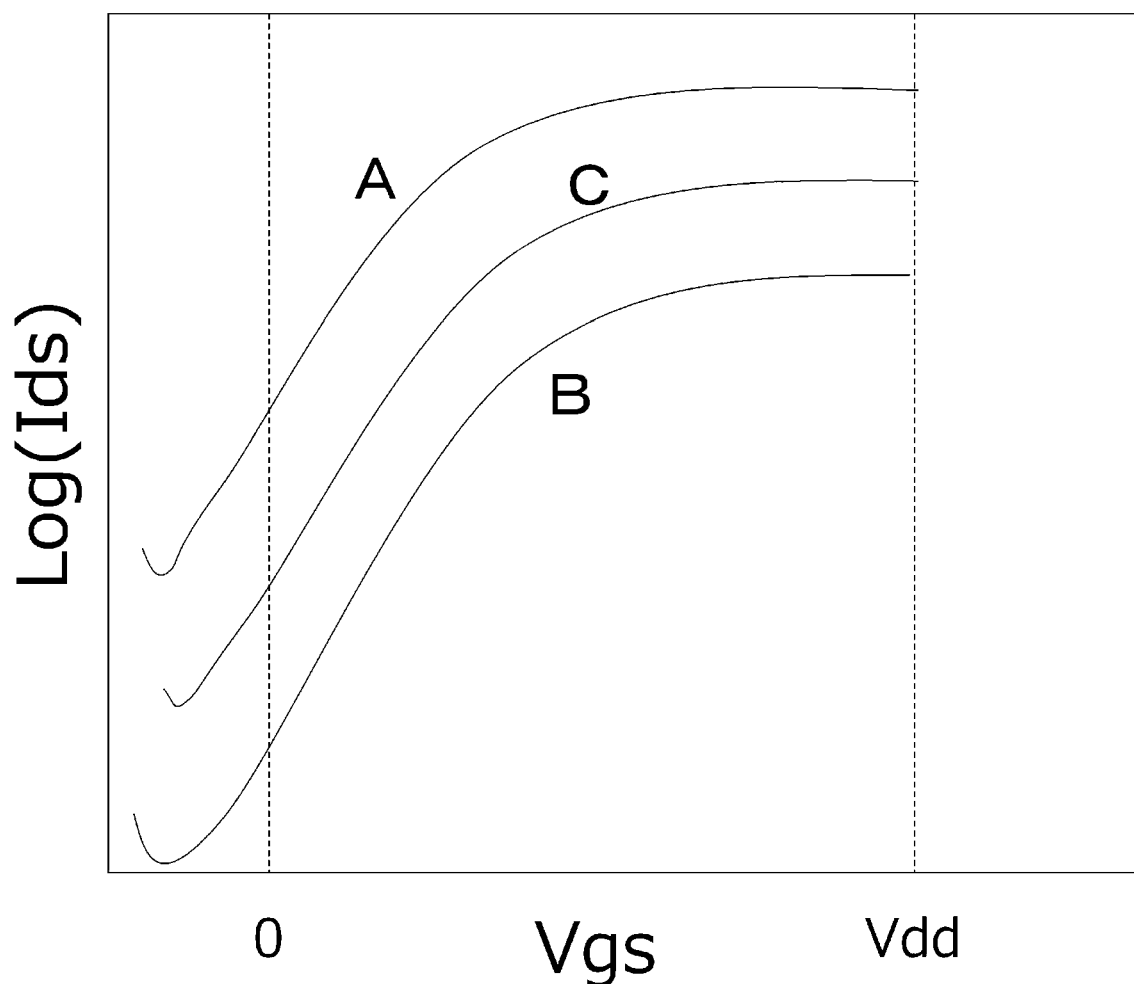
FIG. 16 is a diagram illustrated to describe that the reduction in leakage current can be achieved while improving performance in tune with the operation of a semiconductor device by applying a back bias to a channel formation region.

The relationship between the potential $V_{gs}$ applied to the gate electrode layer and the current $I_{ds}$ flowing through the channel formation region layer is schematically illustrated in FIG. 16. In one example, the first contact portions $43_1$ and $43_3$ are connected to the first wiring (specifically, e.g., a wiring functioning as a signal line), and the second contact portion $44_2$ is connected to the second wiring (specifically, a wiring functioning as a back bias potential power supply line). In one example, a $V_{gs}$-$I_{ds}$ curve obtained when 0 V to $V_{dd}$ volt is applied to the first wiring and $V_{dd}$ volt (or, e.g., fixed to 2 $V_{dd}$) is fixedly applied to the second wiring is denoted as "A", which shows that it is possible to improve the performance in tune with the operation of the semiconductor device. On the other hand, a $V_{gs}$-$I_{ds}$ curve obtained when 0 V to $V_{dd}$ volt is applied to the first wiring and $-V_{dd}$ (or, e.g., fixed to $-2$ $V_{dd}$) is fixedly applied to the second wiring is denoted as "B". Moreover, the relationship between the potential $V_{gs}$ and the current $I_{ds}$ in the semiconductor device in related art having the structure to which a back bias fails to be applied is schematically denoted as "C".

In a case where the wiring length of a signal line of a logic circuit is short and a gate electrode layer connected to the signal line is formed above and below a channel formation region layer, transfer destination of heat generated in the channel formation region layer is typically limited. Thus, the heat radiation effect is expected to fail to be achieved. On the other hand, in the semiconductor device according to the first embodiment, one of the gate electrode layers formed on both ends of the channel formation region layer is connected to a wiring, which has a very long wiring length and is used for applying a back bias (the second wiring). Thus, the heat generated in the channel formation region layer is capable of being effectively dissipated, resulting in weakening the self-heating effect and minimizing the performance degradation. The degree of deterioration due to the self-heating effect is determined depending on many factors, and so it is difficult to be determined unconditionally. However, in the case of the semiconductor device in the related art, it is sufficiently conceivable that approximately 20% of performance degradation occurs. In other words, in the semiconductor device according to the first embodiment, it is considered that the effect of reducing the performance deterioration due to the self-heating effect of approximately 20% can be obtained.

Second Embodiment

Figure 7A:
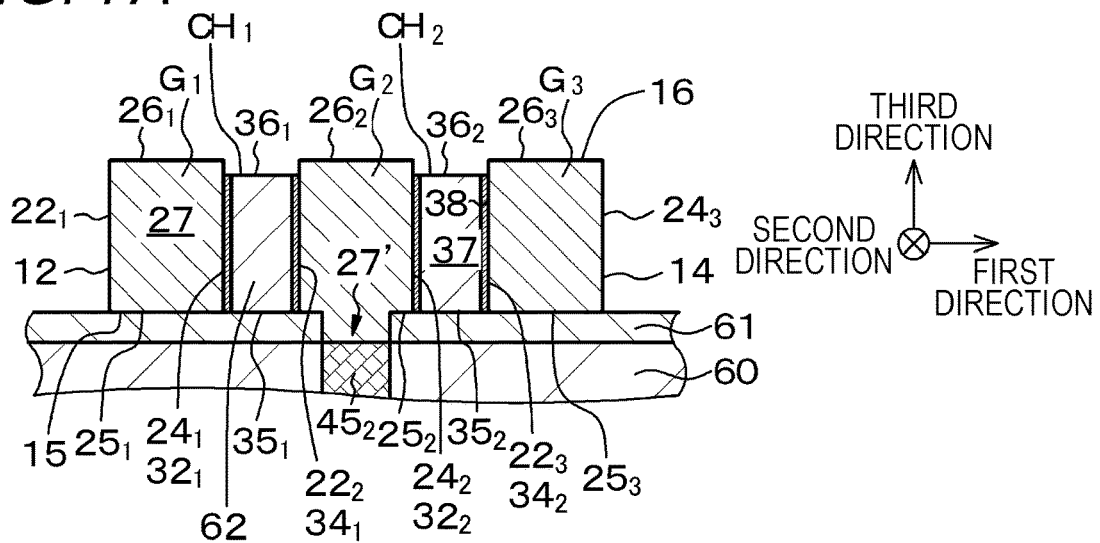
FIGS. 7A, 7B, and 7C are respectively similar schematic partial end views of a semiconductor device according to a second embodiment, taken along the arrows A-A, B-B, and C-C in FIG. 1.
Figure 7B:
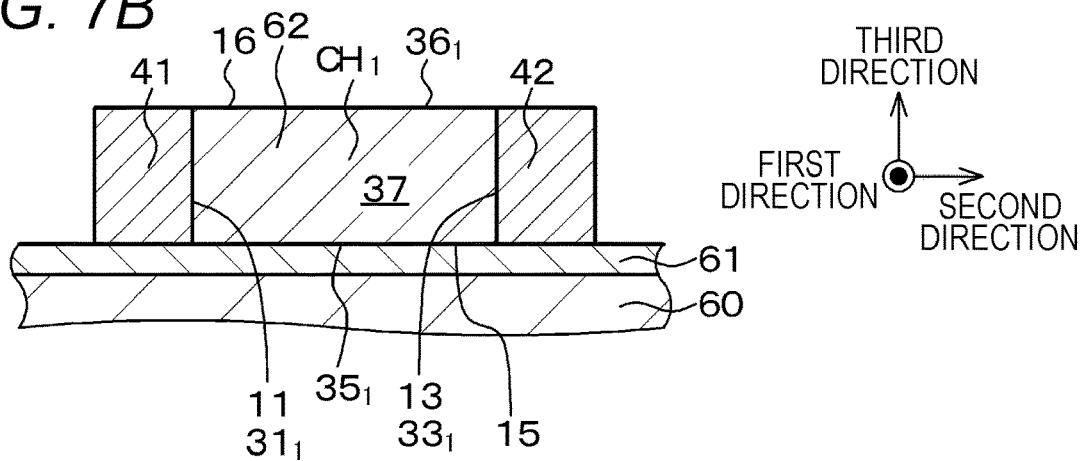
Figure 7C:
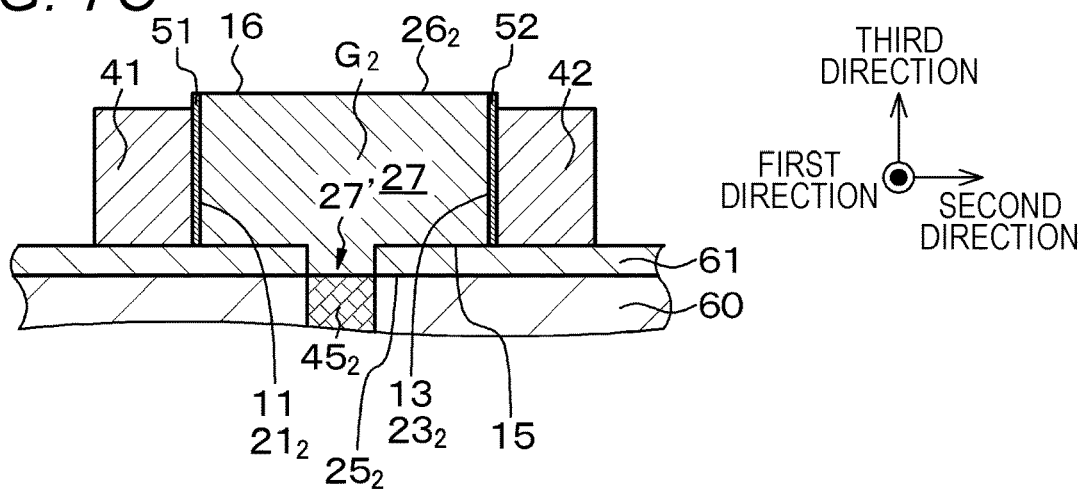
Figure 8A:
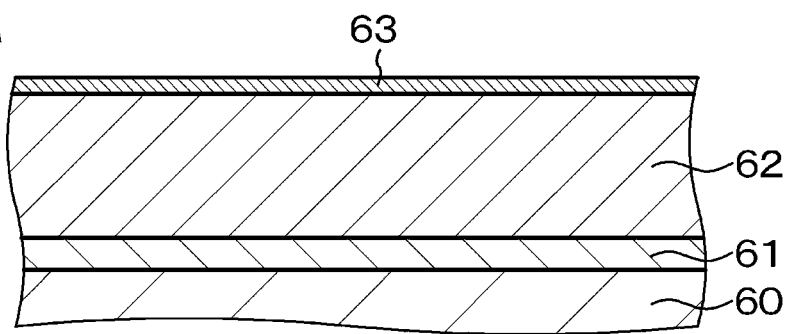
FIGS. 8A, 8B, 8C, and 8D are similar schematic partial end views of a base or the like, taken along the arrow A-A in FIG. 1, for describing a method of manufacturing the semiconductor device according to the second embodiment.
Figure 8B:
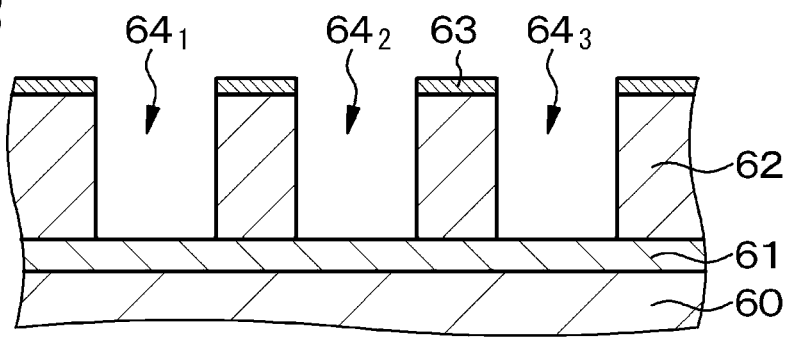
Figure 8C:
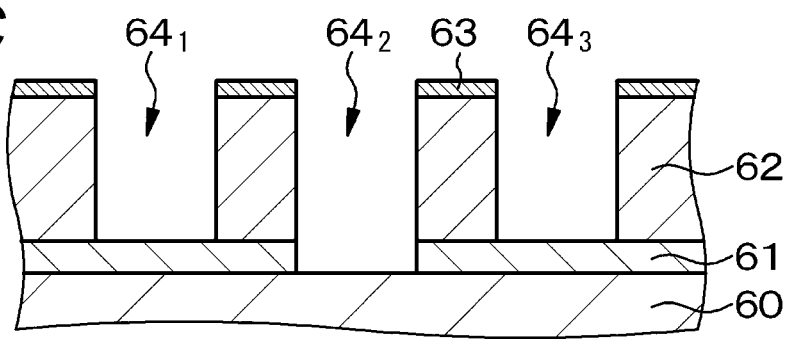
Figure 8D:
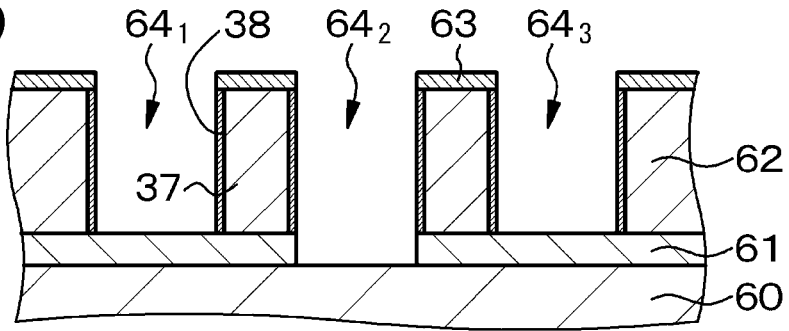
Figure 9A:
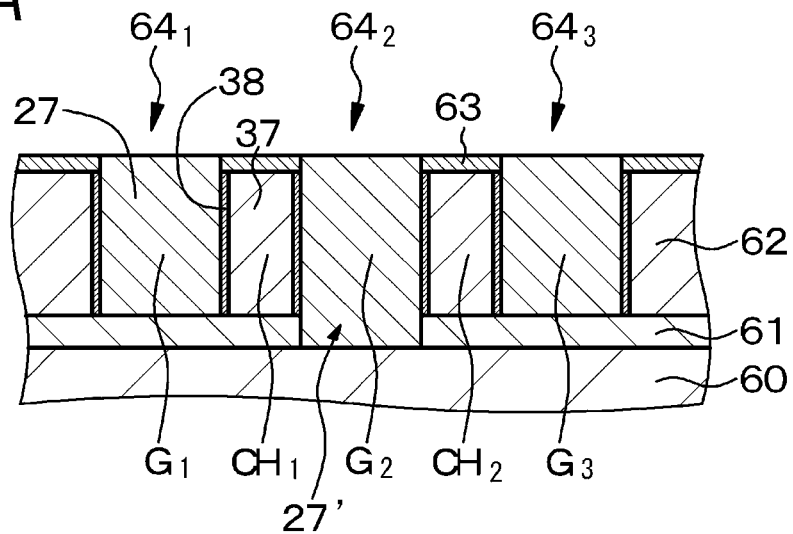
FIGS. 9A, 9B, and 9C, following
Figure 9B:
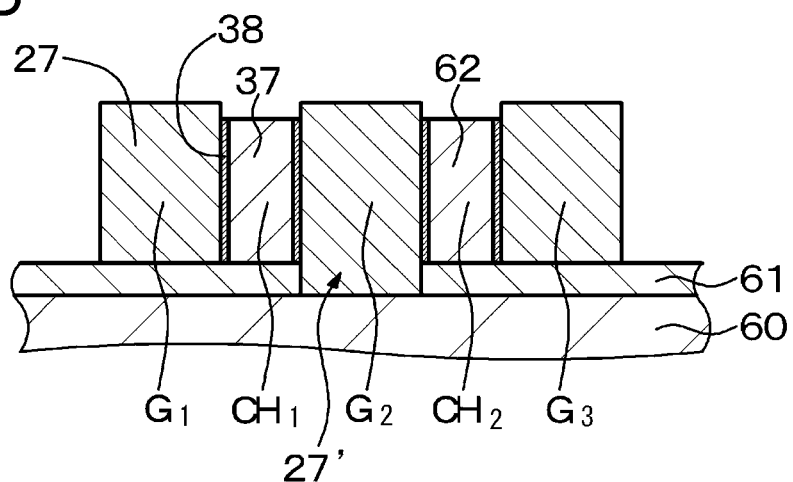
Figure 9C:
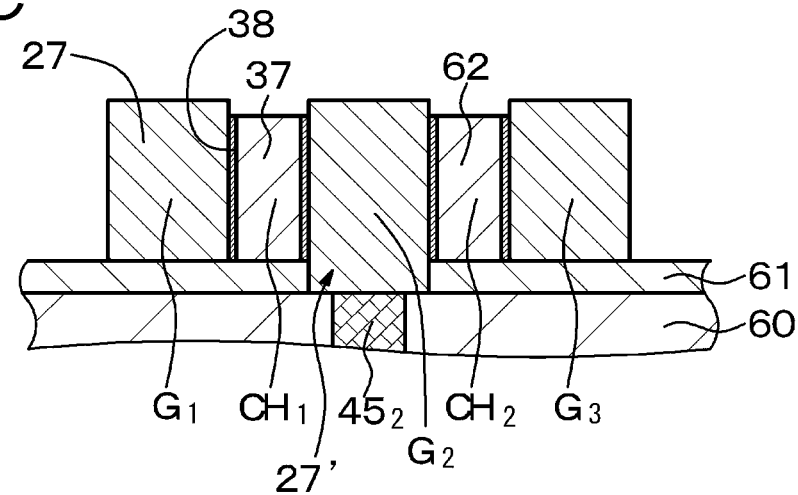

A second embodiment is a modification according to the first embodiment. FIGS. 7A, 7B, and 7C are similar schematic partial end views of a semiconductor device according to the second embodiment, which are respectively taken along the arrows A-A, B-B, and C-C in FIG. 1.

In the semiconductor device according to the second embodiment, the first contact portions $43_1$ and $43_3$ are formed above the base and are connected to the first wiring (specifically, the wiring functioning as a signal line). On the other hand, an extension 27' of the gate electrode layer $G_2$ penetrates the insulating material layer 61. A second contact portion $45_2$ connected to the extension 27' of the gate electrode layer $G_2$ is connected to the second wiring (specifically, e.g., the wiring functioning as a back bias potential power supply line, but not shown) formed on the conductive substrate 60. More specifically, the extension 27' of the gate electrode layer $G_2$ penetrates the insulating material layer 61. Except for these points, the configuration and structure of the semiconductor device according to the second embodiment can be similar to those of the semiconductor device according to the first embodiment, and so detailed description thereof is omitted.

Figure 10A:
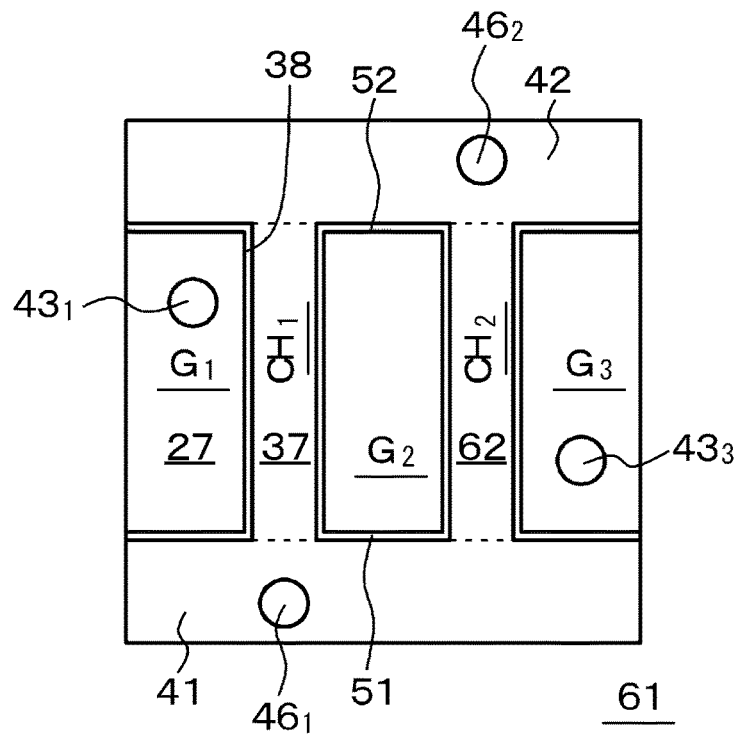
FIG. 10A is a schematic partial plan view of a base or the like for describing the method of manufacturing the semiconductor device according to the second embodiment, following FIG. 9C.
Figure 10B:
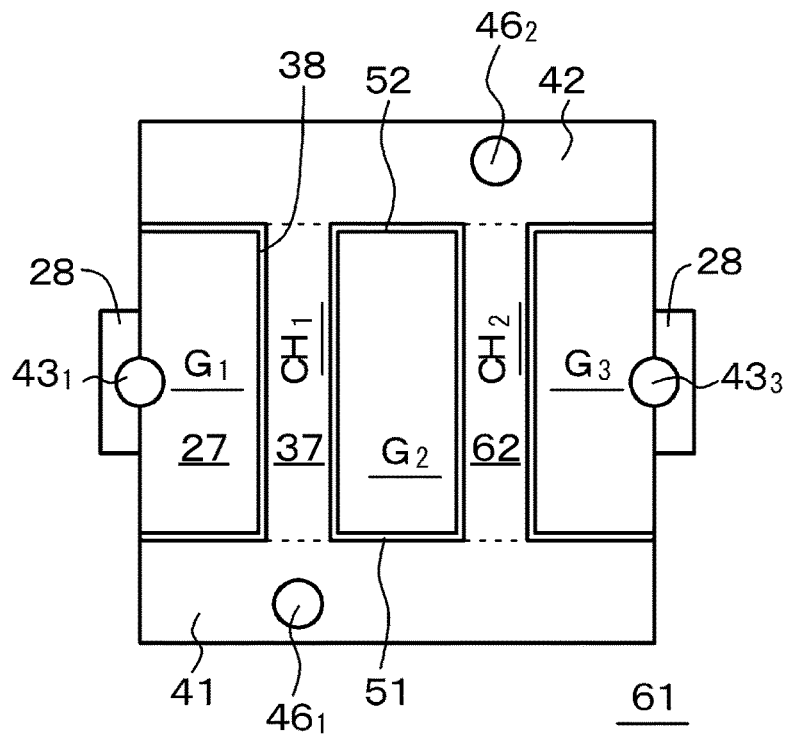
FIG. 10B is a conceptual diagram showing arrangement of respective components of a modification of the semiconductor device according to the second embodiment.

A method of manufacturing the semiconductor device according to the second embodiment is now described with reference to FIGS. 8A, 8B, 8C, 8D, 9A, 9B, and 9C and FIGS. 10A and 10B, for describing the method of manufacturing the semiconductor device according to the second embodiment. FIGS. 8A, 8B, 8C, 8D, 9A, 9B, and 9C are similar schematic partial end views of the base or the like, taken along the arrow A-A in FIG. 1. FIGS. 10A and 10B are similar schematic partial plan views of the base or the like.

[Process-200]

First, similar to [Process-100] of the first embodiment, a protective layer 63 including SiN is first formed on the top surface of the silicon layer 62 of the SOI substrate using the CVD method. Thus, the structure shown in FIG. 8A can be obtained.

[Process-210]

Then, similarly to [Process-110] according to the first embodiment, the portions of the silicon layer 62 where the gate electrode layers $G_1$, $G_2$, and $G_3$ are to be formed are removed to be a trench shape. Thus, the structure shown in FIG. 8B can be obtained. Subsequently, the insulating material layer 61 located at the bottom of the region where the gate electrode layer $G_2$ is to be formed is removed. Specifically, an etching resist layer (not shown) having an opening in a region where the gate electrode layer $G_2$ is to be formed is provided on the protective layer 63. Then, the insulating material layer 61 located at the bottom of the opening $64_2$ is etched using the etching resist layer, and then the etching resist layer is removed. Thus, the structure shown in FIG. 8C can be obtained. The portion of the opening $64_2$ where the extension 27' of the gate electrode layer $G_2$ is to be formed extends through the insulating material layer 61 and penetrates the insulating material layer 61.

[Process-220]

Then, the channel structure portion 37 and the insulating portion 38 (corresponding to the gate insulating film) are formed in the silicon layer 62 similarly to [Process-120] according to the first embodiment to obtain the channel formation region layers $CH_1$ and $CH_2$. Thus, the structure shown in FIG. 8D can be obtained. In addition, as described above, the insulating films 51 and 52 can be formed together.

[Process-230]

Subsequently, similar to [Process-130] of the first example, a gate electrode forming layer 27 made of TiN is formed on the entire surface using the CVD method, then the gate electrode forming layer 27 above the channel formation region layers $CH_1$ and $CH_2$ is removed by performing the flattening process. The gate electrode forming layer 27 made of TiN fills the insides of the openings $64_1$, $64_2$ and $64_3$. Thus, the gate electrode layers $G_1$, $G_2$, and $G_3$ can be obtained (see FIG. 9A).

[Process-240]

Then, similar to [Process-140] of the first example, the unnecessary silicon layer 62 is removed using the photolithography technique and the etching technique. Then, the protective layer 63 on the channel formation region layers $CH_1$ and $CH_2$ is removed using the photolithography technique and the etching technique, which enables obtaining of the source/drain regions 41 and 42 made of the silicon layer 62. In this way, the structures shown in FIG. 9B can be obtained.

[Process-250]

Then, an interlayer insulating layer (not shown) is formed on the entire surface, and openings are formed in the interlayer insulating layers above the source/drain regions 41 and 42 and the gate electrode layers $G_1$ and $G_3$. Then, a conductive layer is formed on the interlayer insulating layer having the opening, and the conductive layer is patterned using the photolithography technique and the etching technique. Thus, the first contact portions $43_1$ and $43_3$ can be obtained, connection holes $46_1$ and $46_2$ connected to the source/drain regions 41 and 42 (see FIG. 10A) can be obtained, and the first wiring (not shown) can be obtained. Thus, it is possible to obtain the first contact portions $43_1$ and $43_3$ formed above the base and connected to the first wiring. Moreover, the first wiring is formed on the interlayer insulating layer.

[Process-260]

Then, in one example, the conductive substrate 60 is thinned from the back surface using the CMP method. Then, the second contact portion $45_2$, which is connected to the extension 27' of the gate electrode layer $G_2$ and penetrates the insulating material layer 61, is formed inside the conductive substrate 60 using a known method. In addition, the second wiring (not shown) connected to the second contact portion $45_2$ is formed on the back surface of the conductive substrate 60. Thus, the structures shown in FIGS. 9C, 7A, 7B, and 7C can be obtained.

In some cases, in [Process-210], after the insulating material layer 61 located at the bottom of the opening $64_2$ is etched using the etching resist layer (see FIG. 8C), the ion implantation is performed on the portion of the conductive substrate 60 exposed at the bottom of the opening $64_2$, and the ion-implanted portion of the conductive substrate 60 can be used as the second contact portion. Then, in this case, in [Process-260], the second wiring connected to the conductive substrate 60 (specifically, e.g., a wiring functioning as a back bias potential power supply line, but not shown) can be formed, which allows the second wiring to be shared by a plurality of semiconductor devices.

Further, as shown in FIG. 10B that is a schematic partial plan view of a modification of the semiconductor device according to the second embodiment, following [Process-240], a gate electrode layer is formed using the CVD method, the photolithography technique, and the etching technique. A protruding portion 28 can be provided on a part of the second surface $22_1$ of the gate electrode layer $G_1$ and the fourth surface $24_3$ of the gate electrode layer $G_3$. The protruding portion 28 provided as described above facilitates the formation (alignment) of the first contact portions $43_1$ and $43_3$. Alternatively, such a protruding portion can be obtained by forming areas where the protruding portions 28 are to be provided in the openings $64_1$ and $64_3$ when the openings $64_1$ and $64_3$ are formed. The protruding portion 28 as described above can be applied to other embodiments.

Third Embodiment

Figure 11A:
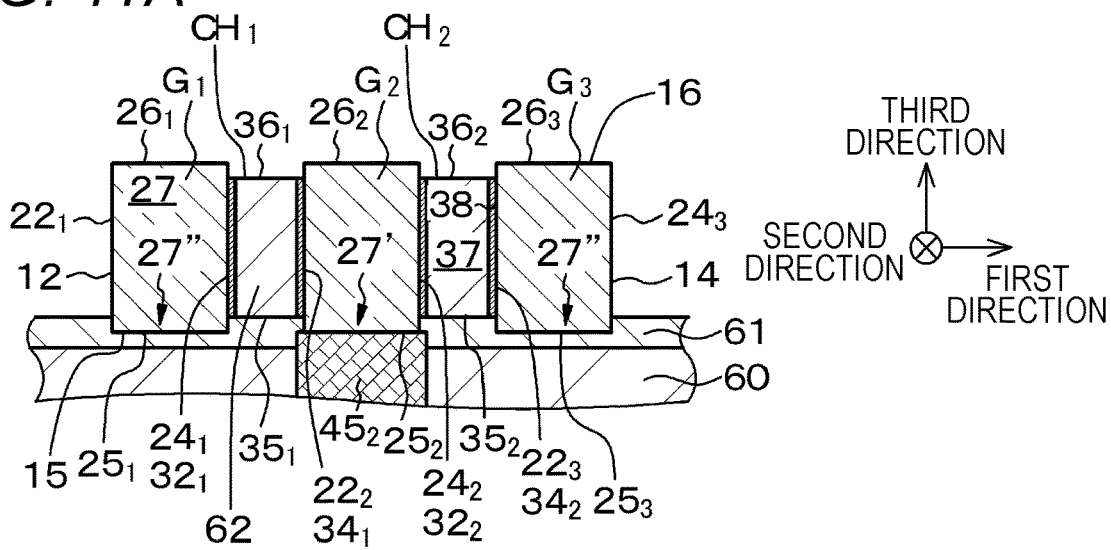
FIGS. 11A, 11B, and 11C are respectively similar schematic partial end views of a semiconductor device according to a third embodiment, taken along the arrows A-A, B-B, and C-C in FIG. 1.
Figure 11B:
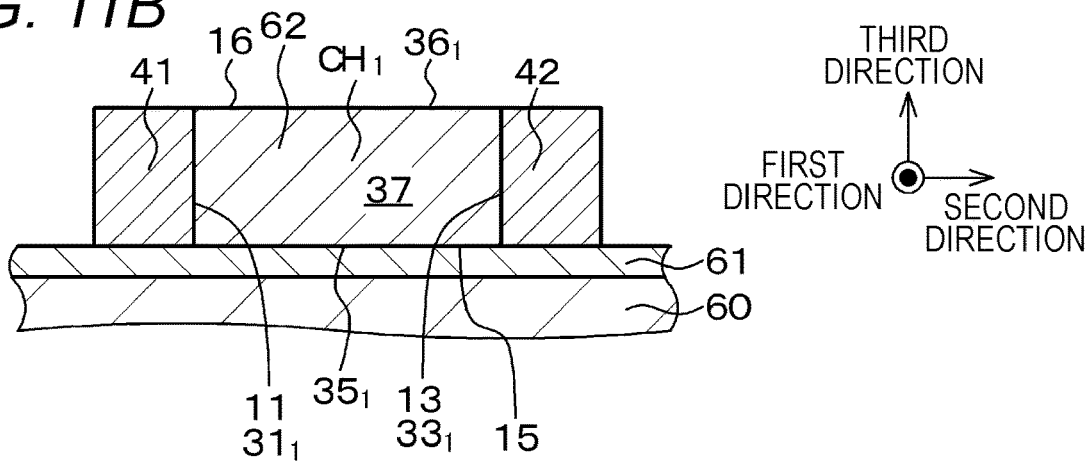
Figure 11C:
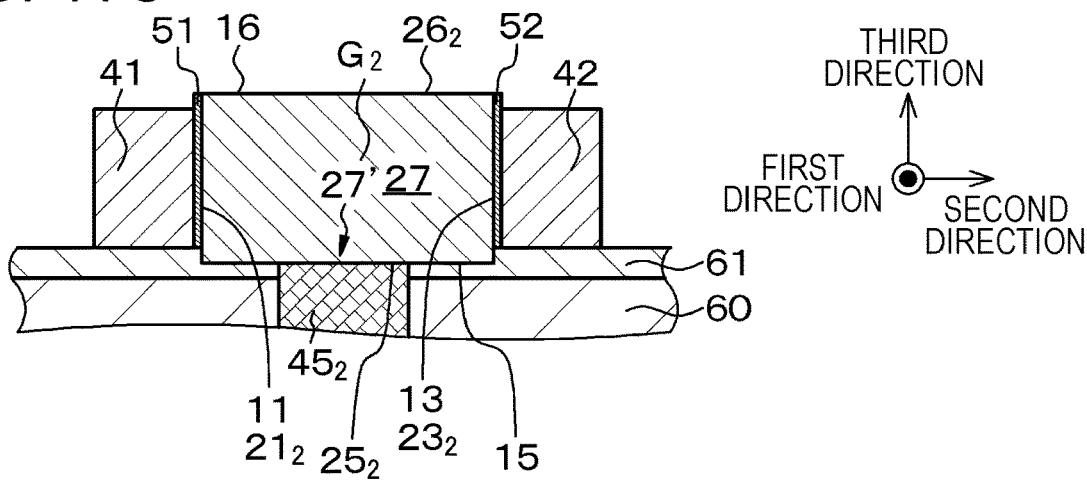

A third embodiment is a modification according to the second embodiment. FIGS. 11A, 11B, and 11C are similar schematic partial end views of a semiconductor device according to the third embodiment, which are respectively taken along the arrows A-A, B-B, and C-C in FIG. 1.

In the semiconductor device according to the third embodiment, the extension 27' of the gate electrode layer $G_2$ extends in the insulating material layer 61, but does not penetrate the insulating material layer 61. On the other hand, the second contact portion $45_2$ extends inside the conductive substrate 60 and further inside the insulating material layer 61. Then, the extension 27' of the gate electrode layer $G_2$ is connected with the second contact portion $45_2$ in the insulating material layer 61.

Further, extensions 27" of the gate electrode layers $G_1$ and $G_3$ also extend in the insulating material layer 61. However, the extensions 27" of the gate electrode layers $G_1$ and $G_3$ do not penetrate the insulating material layer 61.

The silicon layer 62 is etched in a trench shape and partially etching the insulating material layer 61 in its thickness direction (Z-direction) in a process similar to [Process-110] according to the first embodiment. Then, a portion of the insulating material layer 61 that is placed between the conductive substrate 60 and the extension 27' of the gate electrode layer $G_2$ extending inside the insulating material layer 61 is removed and the second contact portion $45_2$ in the removed portion is formed in a process similar to [Process-260] according to the second embodiment. Thus, the structure as described above can be obtained.

Except for the points described above, the configuration and structure of the semiconductor device according to the third embodiment are similar to those of the semiconductor device described in the second embodiment, and so detailed description thereof is omitted.

Fourth Embodiment

A fourth embodiment is a modification of the second and third embodiments. FIG. 12B is a similar schematic partial end view of a semiconductor device according to the fourth embodiment, which is taken along the arrow A-A in FIG. 1.

In the semiconductor device according to the fourth embodiment, the direction from the second side surface 12 of the structure to the fourth side surface 14 of the structure is defined as the first direction (X-direction). In this case, the thickness $t_2$ along the first direction (X-direction) of the gate electrode layer $G_2$ connected to the second contact portion $45_2$ is larger than the thickness $t_1$ along the first direction (X-direction) of the gate electrode layers $G_1$ and $G_3$ connected to the first contact portions $43_1$ and $43_3$. An example of the relationship between $t_2$ and $t_1$ can be given as follows:

$$1.2 \leq t_2/t_1 \leq 3$$

Specifically, the fourth embodiment gives an example as follows:

$$t_2/t_1 = 2.0$$

The relationship of $t_2/t_1$ given as mentioned above causes a so-called microloading effect. Thus, the region of the silicon layer 62 where the gate electrode layer $G_2$ is to be formed and the region of the insulating material layer 61 are removed. On the other hand, the region of the silicon layer 62 where the gate electrode layers $G_1$ and $G_3$ are to be formed and a part of the region of the insulating material layer 61 are removed (see FIG. 12A). Thus, the extension 27' of the gate electrode layer $G_2$ penetrates the insulating material layer 61, while the extension 27" of the gate electrode layers $G_1$ and $G_3$ extends in the insulating material layer 61 but does not penetrate the insulating material layer 61 (see FIG. 12B).

Except for the points described above, the configuration and structure of the semiconductor device according to the fourth embodiment are similar to those of the semiconductor device described in the second embodiment and the third embodiment, and so detailed description thereof is omitted.

FIG. 13 is a similar schematic partial end view taken along the arrow A-A in FIG. 1 as a modification of the semiconductor device according to the fourth embodiment. This modification shows a structure in which N gate electrode layers $G_1$, $G_2$, $G_3$, $G_4$, and $G_5$ and (N−1) channel formation region layers $CH_1$, $CH_2$, $CH_3$, $CH_4$ (where N≥3, specifically N=5 in this modification) are alternately juxtaposed on an insulating material layer 61. A conductive substrate 60 and the insulating material layer 61 formed on the surface of the conductive substrate 60 constitute a base. Then, the thickness $t_2$ of the gate electrode layers $G_2$ and $G_4$ connected to the second contact portion $45_2$ is larger than the thickness $t_1$ of the gate electrode layers $G_1$, $G_3$, and $G_5$ respectively connected to the first contact portions $43_1$, $43_3$ and $43_5$ (not shown). The gate electrode layers $G_2$ and $G_4$ share the second contact portion $45_2$.

Fifth Embodiment

A fifth embodiment is a modification of the first to fourth embodiments, and a channel structure 37' has nanowire structure. The channel structure 37' having such a nanowire structure can be obtained, in one example, by the following method. Moreover, the channel structure portion that forms one channel formation region layer includes a plurality of nanowire structures extending in the second direction (Y-direction), and the outer peripheral portions of these nanowire structures are covered with insulating portions (corresponding to gate insulating films). Then, in one channel formation region layer, a plurality of nanowire structures (specifically, three nanowire structures) are juxtaposed along the third direction (Z-direction). Moreover, the drawings in the following description are similar schematic partial end views taken along the arrow A-A in FIG. 1.

Figure 14A:
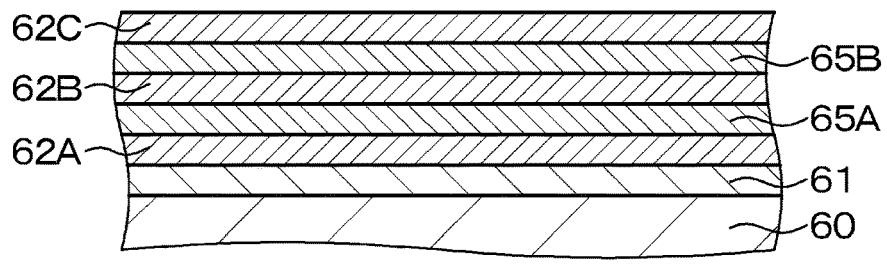
FIGS. 14A, 14B, 14C, and 14D are similar schematic partial end views of a base or the like, taken along the arrow A-A in FIG. 1, for describing a method of manufacturing the semiconductor device according to the fifth embodiment.

In other words, first, a first sacrificial layer 65A made of SiGe is formed on a silicon layer (a first silicon layer 62A) on an SOI substrate using the epitaxial growth method. A second silicon layer 62B is formed on the first sacrificial layer 65A using the epitaxial growth method. A second sacrificial layer 65B made of SiGe is formed on the second silicon layer 62B using the epitaxial growth method. A third silicon layer 62C is formed on the second sacrificial layer 65B using the epitaxial growth method. In this way, it is possible to obtain a stacked structure including the first silicon layer 62A, the first sacrificial layer 65A, the second silicon layer 62B, the second sacrificial layer 65B, and the third silicon layer 62C (see FIG. 14A).

Figure 14B:
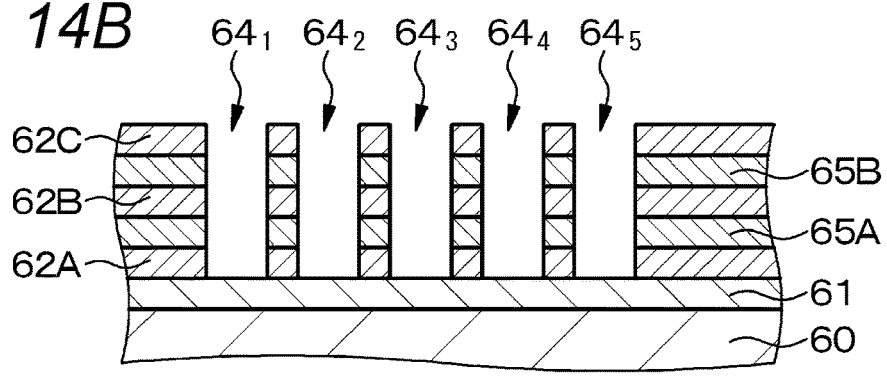
Figure 14C:
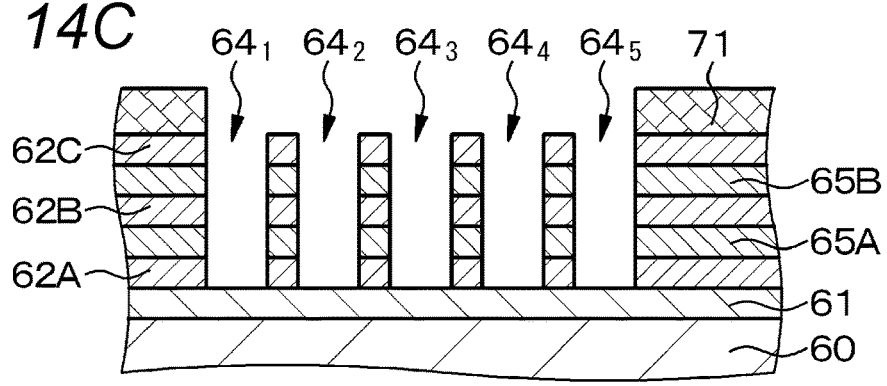
Figure 14D:
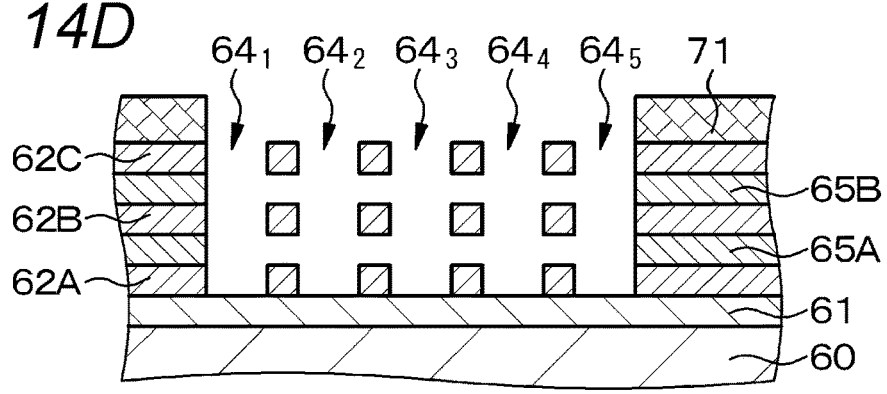

Then, a portion of the stacked structure where the gate electrode layer is to be formed is removed in a trench shape by the photolithography technique and the etching technique (see FIG. 14B). Then, a mask layer 71 is formed on a desired region (see FIG. 14C). Then, the first sacrificial layer 65A and the second sacrificial layer 65B made of SiGe are removed using an etchant having etching selectivity with respect to the first silicon layer 62A, the second silicon layer 62B, and the third silicon layer 62C (FIG. 14D). Both ends of the channel structure portion 37' having nanowire structure are supported by portions (not shown) of the stacked structure that will be the source/drain regions 41 and 42.

Figure 15A:
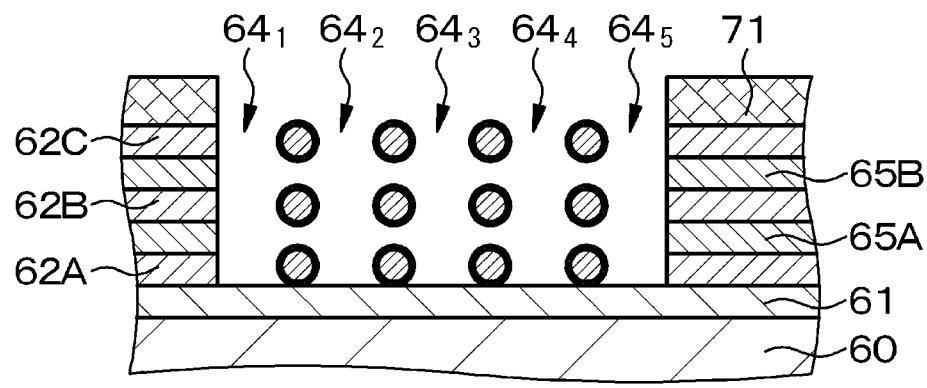
FIGS. 15A and 15B, following
Figure 15B:
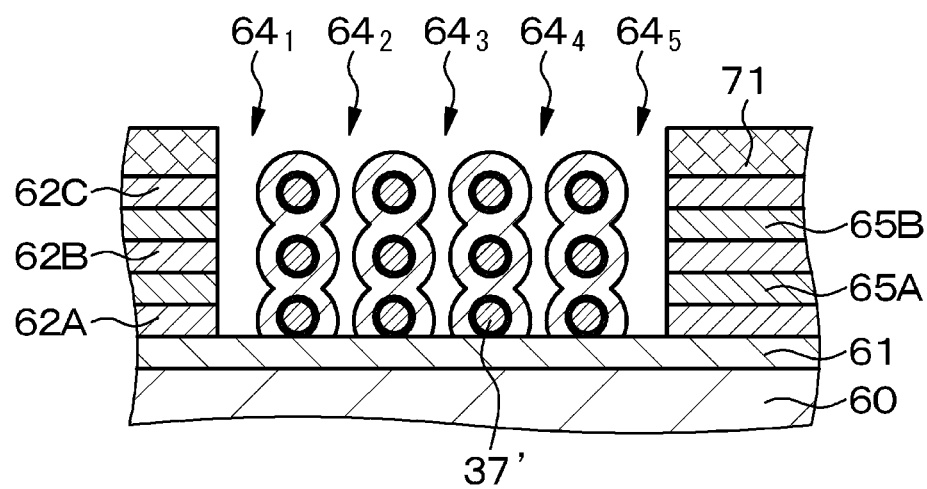

Then, a part of the insulating portion 38 corresponding to the gate insulating film made of SiON is formed by performing the thermal oxidation on a channel structure portion 37' (see FIG. 15A). The thermal oxidation makes the cross-sectional shape of the channel structure portion having the nanowire structure circular. Then, the remaining portion of the insulating portion 38 made of HfO$_2$ is formed on a part of the insulating portion 38 using the ALD method (see FIG. 15B).

Then, the process similar to [Process-130] and subsequent processes of first embodiment and the process similar to [Process-230] and subsequent processes of second embodiment make it possible to obtain the semiconductor device according to the fifth embodiment having the configuration and structure similar to those of the semiconductor devices described in the first to fourth embodiments except for the structure of the channel structure portion.

Although the present disclosure is described above on the basis of the preferred embodiments, the configuration and structure of the semiconductor device, the material forming the semiconductor device, and the method of manufacturing the semiconductor device described in the embodiments are merely examples and can be appropriately modified. In addition, the order of the processes in the method of manufacturing the semiconductor device according to the embodiments can be appropriately modified as desired. In the embodiments, the n-channel semiconductor device is used, but a p-channel semiconductor device can be used. In this case, the material forming the semiconductor device is only required to be appropriately modified. In the embodiments, although the structure is described in which two channel formation region layers and three gate electrode layers, or four channel formation region layers and five gate electrode layers are alternately juxtaposed, the structure is not limited to such a structure. A structure can be employed in which the channel formation region layers having (N−1) layers (where N=4, 5, 6, . . . ) and the N gate electrode layers are alternately stacked. The second wiring can be provided for each semiconductor device, or can be provided for each of a plurality of semiconductor devices. In other words, the second wiring can be shared by a plurality of semiconductor devices. Such a structure makes it possible for the heat dissipation area to be further increased and for the dissipation of the heat by the second wiring to be further increased, resulting in further reducing the self-heating effect.

The embodiments describe that the odd-numbered gate electrode layer (the first gate electrode layer) is connected to the first contact portion and the first wiring and the even-numbered gate electrode layer (the second gate electrode layer) is connected to the second contact portion and the second wiring. On the other hand, it is possible to make a configuration in which the odd-numbered gate electrode layer (the first gate electrode layer) is connected to the second contact portion and the second wiring, and the even-numbered gate electrode layer (the second gate electrode layer) is connected to the first contact portion and the first wiring.

It is also possible to obtain the SiGe layer by a process of placing a SiGe layer on the upper layer and a Si layer on the lower layer and performing the oxidation to cause the upper SiGe layer to be SiO$_2$ and the lower Si layer to be SiGe layer.

Note that the present disclosure may also include the following configuration.

[A01] <<Semiconductor Device>>

A semiconductor device including:

a structure having N gate electrode layers and (N−1) channel formation region layers (where N≥3) alternately juxtaposed on an insulating material layer of a base in which the insulating material layer is formed on a surface of a conductive substrate, in which the structure has a bottom surface, a top surface opposing the bottom surface, a first side surface, a second side surface, a third side surface opposing the first side surface, and a fourth side surface opposing the second side surface, the channel formation region layer has a bottom surface forming the bottom surface of the structure, a top surface forming the top surface of the structure, a first side surface forming the first side surface of the structure, a second side surface, a third side surface forming the third side surface of the structure, and a fourth side surface opposing the second side surface, the gate electrode layer has a bottom surface forming the bottom surface of the structure, a top surface forming the top surface of the structure, a first side surface forming the first side surface of the structure, a second side surface, a third side surface forming the third side surface of the structure, and a fourth side surface opposing the second side surface, a second surface of a 1$^{st}$ layer of the gate electrode layers forms the second side surface of the structure, a fourth surface of an N$^{th}$ layer of the gate electrode layers forms the fourth side surface of the structure, a second surface of an n$^{th}$ (where n=1, 2, . . . , (N−1)) layer of the channel formation region layers is in contact with the fourth surface of the n$^{th}$ gate electrode layer, a fourth surface of the n$^{th}$ layer of the channel formation region layers is in contact with a second surface of a (n+1)$^{th}$ layer of the gate electrode layers, and one of an odd-numbered layer of the gate electrode layers and an even-numbered layer of the gate electrode layers is connected to a first contact portion and the other is connected to a second contact portion. [A02] The semiconductor device according to [A01], in which the channel formation region layer includes a channel structure portion having a nanowire structure or a nanosheet structure, and an insulating portion. [A03] The semiconductor device according to [A01] or [A02], in which a first surface of the channel formation region layer is connected to one of source/drain regions common to the channel formation region layer, and a third surface of the channel formation region layer is connected to the other of the source/drain regions common to the channel formation region layer. [A04] The semiconductor device according to any one of [A01] to [A03], in which the first contact portion is formed above the base and is connected to a first wiring, the gate electrode layer has an extension extending in the insulating material layer, and the second contact portion connected to the extension of the gate electrode layer is connected to a second wiring formed on the conductive substrate. [A05] The semiconductor device according to [A04], in which the extension of the gate electrode layer penetrates the insulating material layer. [A06] The semiconductor device according to [A04] or [A05], in which a thickness along a first direction of the gate electrode layer connected to the second contact portion is larger than a thickness along the first direction of the gate electrode layer connected to the first contact portion, the first direction being given as a direction from the second side surface of the structure to the fourth side surface of the structure.

REFERENCE SIGNS LIST $G_1$, $G_2$, $G_3$ Gate electrode layer
$CH_1$, $CH_2$ Channel formation region layer
11 First side surface of structure
12 Second side surface of structure
13 Third side surface of structure
14 Fourth side surface of structure 15 Bottom surface of structure
16 Top surface of structure
$21_1$, $21_2$ First side surface of gate electrode layer
$22_1$, $22_2$ Second side surface of gate electrode layer
$23_1$, $23_2$ Third side surface of gate electrode layer
$24_1$, $24_2$ Fourth side surface of gate electrode layer
$25_1$, $25_2$ Bottom surface of gate electrode layer
$26_1$, $26_2$ Top surface of gate electrode layer
27 Gate electrode forming layer
27' Extension of gate electrode layer
28 Protruding portion
$31_1$, $31_2$ First side surface of channel formation region layer
$32_1$, $32_2$ Second side surface of channel formation region layer
$33_1$, $33_2$ Third side surface of channel formation region layer
$34_1$, $34_2$ Fourth side surface of channel formation region layer
$35_1$, $35_2$ Bottom surface of channel formation region layer
$36_1$, $36_2$ Top surface of channel formation region layer
37, 37' Channel structure portion
38 Insulating portion
41, 42 Source/drain region
$43_1$, $43_3$ First contact portion
$44_2$, $45_2$ Second contact portion
$46_1$, $46_2$ Connection hole
51, 52 Insulating film
60 Conductive substrate
61 Insulating material layer
62, 62A, 62B, 62C Silicon layer
63 Protective layer
$64_1$, $64_2$, $64_3$ Opening
65A, 65B Sacrificial layer
71 Mask layer

What is claimed is:

1. A semiconductor device, comprising:
a structure having N gate electrode layers and (N−1) channel formation region layers (where N≥3) alternately juxtaposed on an insulating material layer of a base in which the insulating material layer is formed on a surface of a conductive substrate,
wherein the structure has a bottom surface, a top surface opposing the bottom surface, a first side surface, a second side surface, a third side surface opposing the first side surface, and a fourth side surface opposing the second side surface,
wherein each of the channel formation region layers has a bottom surface forming a portion of the bottom surface of the structure, a top surface forming a portion of the top surface of the structure, a first side surface forming a portion of the first side surface of the structure, a second side surface, a third side surface forming a portion of the third side surface of the structure, and a fourth side surface opposing the second side surface,
wherein each of the gate electrode layers has a bottom surface forming a portion of the bottom surface of the structure, a top surface forming a portion of the top surface of the structure, a first side surface forming a portion of the first side surface of the structure, a second side surface, a third side surface forming a portion of the third side surface of the structure, and a fourth side surface opposing the second side surface,
wherein the second surface of a $1^{st}$ layer of the gate electrode layers forms the second side surface of the structure,
wherein the fourth surface of an $N^{th}$ layer of the gate electrode layers forms the fourth side surface of the structure,
wherein the second surface of an $n^{th}$ (where n=1, 2, . . . , (N−1)) layer of the channel formation region layers is in contact with the fourth surface of the $n^{th}$ gate electrode layer,
wherein the fourth surface of the $n^{th}$ layer of the channel formation region layers is in contact with a second surface of a $(n+1)^{th}$ layer of the gate electrode layers,
wherein one of an odd-numbered layer of the gate electrode layers and an even-numbered layer of the gate electrode layers is connected to a first contact portion and the other is connected to a second contact portion,
wherein the first contact portion is formed above the base and is connected to a first wiring,
wherein the layer of the gate electrode layers connected to the second contact portion has an extension extending into the insulating material layer,
wherein the second contact portion is connected to the extension of the one of the gate electrode layers and is connected to a second wiring formed on the conductive substrate, and
wherein a thickness along a first direction of the gate electrode layer connected to the second contact portion is larger than a thickness along the first direction of the gate electrode layer connected to the first contact portion, the first direction being given as a direction from the second side surface of the structure to the fourth side surface of the structure.

2. The semiconductor device according to claim 1, wherein the channel formation region layers include a channel structure portion having a nanowire structure or a nanosheet structure, and an insulating portion.

3. The semiconductor device according to claim 1, wherein a first surface of each of the channel formation region layers is connected to one of source/drain regions common to the channel formation region layer, and
wherein a third surface of each of the channel formation region layers is connected to the other of the source/drain regions common to the channel formation region layer.

4. The semiconductor device according to claim 1, wherein the extension of the layer of the gate electrode layers connected to the second contact portion penetrates the insulating material layer.

5. The semiconductor device according to claim 1, wherein the base is a silicon semiconductor substrate, a Si-on-insulator substrate, or a SiGe-on-insulator substrate.

6. The semiconductor device according to claim 1, wherein the channel formation region layers include Si, SiGe, Ge, or InGaAs.

7. The semiconductor device according to claim 1, wherein the gate electrode layers include TiN, TaN, Al, TiAl, or W.

8. The semiconductor device according to claim 1, wherein the first and fourth side surfaces of the gate electrode layers are covered with an insulating film.

* * * * *